United States Patent
Yamaguchi et al.

(10) Patent No.: US 7,301,420 B2
(45) Date of Patent: Nov. 27, 2007

(54) PIEZOELECTRIC RESONATOR FILTER

(75) Inventors: Hiroshi Yamaguchi, Katano (JP);
Takehiko Yamakawa, Suita (JP);
Hiroshi Nakatsuka, Katano (JP);
Hiroyuki Nakamura, Katano (JP);
Keiji Onishi, Settsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 251 days.

(21) Appl. No.: 10/543,837

(22) PCT Filed: Nov. 19, 2004

(86) PCT No.: PCT/JP2004/017656

§ 371 (c)(1),
(2), (4) Date: Jul. 29, 2005

(87) PCT Pub. No.: WO2005/050840

PCT Pub. Date: Jun. 2, 2005

(65) Prior Publication Data

US 2006/0139120 A1 Jun. 29, 2006

(30) Foreign Application Priority Data

Nov. 20, 2003 (JP) ............................. 2003-391111

(51) Int. Cl.
*H03H 9/70* (2006.01)
*H03H 9/72* (2006.01)
*H03H 9/54* (2006.01)
*H03H 9/64* (2006.01)

(52) U.S. Cl. ..................... 333/133; 333/189; 333/193

(58) Field of Classification Search .............. 333/193, 333/133, 189
See application file for complete search history.

(56) References Cited

U.S. PATENT DOCUMENTS 5,682,126 A * 10/1997 Plesski et al. .............. 333/193

(Continued)

FOREIGN PATENT DOCUMENTS

EP 0 853 381 A2 7/1998

(Continued)

OTHER PUBLICATIONS

K. M. Lakin ED, "Thin Film Resonator Technology", Institute of Electrical and Electronics Engineers: Proceedings of the 2003 IEEE International Frequency Control Cymposium & PDA Exhibition Jointly With the 17th, European Frequency and Time Forum, Tampa, FL, May 4-8, 2003, pp. 765-778, XP010688892, ISBN: 0-7803-7688-9.

*Primary Examiner*—Barbara Summons
(74) *Attorney, Agent, or Firm*—Wenderoth, Lind & Ponack, L.L.P.

(57) ABSTRACT

A piezoelectric resonator filter for allowing a high-frequency signal in a desired frequency band to pass therethrough. The piezoelectric resonator filter presents a low insertion loss while securing satisfactory characteristics in a stop band. The piezoelectric resonator includes two or more reactance elements in serial connection between input and output terminals, at least three or more piezoelectric resonators in parallel connection between the input and output terminals, and an inductor having a grounded end. The reactive elements and resonators of the piezoelectric resonator are arranged in a ladder connection. Among the three or more piezoelectric resonators, only those piezoelectric resonators which do not adjoin each other are connected in common to the inductor.

18 Claims, 29 Drawing Sheets

U.S. PATENT DOCUMENTS

| | | | | |
|---|---|---|---|---|
| 6,150,904 | A | 11/2000 | Taniguchi et al. | 333/193 |
| 6,323,744 | B1 * | 11/2001 | Barber et al. | 333/189 |
| 6,369,672 | B1 | 4/2002 | Ikada | 333/193 |
| 6,404,302 | B1 * | 6/2002 | Satoh et al. | 333/193 |
| 2003/0058066 | A1 | 3/2003 | Taniguchi et al. | 333/193 |
| 2003/0186673 | A1 * | 10/2003 | Kimachi et al. | 455/339 |

FOREIGN PATENT DOCUMENTS

| | | |
|---|---|---|
| EP | 1 050 961 A2 | 11/2000 |
| EP | 1 126 604 A2 * | 8/2001 |
| JP | 7-273597 * | 10/1995 |
| JP | 10-93382 * | 4/1998 |
| JP | 2001-24476 | 1/2001 |
| JP | 2002-217680 * | 8/2002 |
| JP | 2002-304178 | 10/2002 |
| JP | 2003-298392 | 10/2003 |
| JP | 2004-112277 | 4/2004 |

* cited by examiner

PIEZOELECTRIC RESONATOR FILTER

FIELD OF THE INVENTION

The present invention relates to a filter for use in an electronic device such as a mobile communication device. More particularly, the present invention relates to a filter incorporating piezoelectric resonators.

DESCRIPTION OF THE RELATED ART

Component parts to be internalized in an electronic device such as a mobile communication device are required to be smaller and lighter. For example, a filter to be used in a mobile communication device needs to be small-sized and have finely adjusted frequency characteristics.

As an example of a filter which satisfies such requirements, a filter incorporating a piezoelectric resonator is proposed. A piezoelectric resonator is a resonator composed of a piezoelectric material. Ideally, a "piezoelectric resonator" refers to a resonator which has both a frequency (resonance frequency) at which zero impedance is exhibited and a frequency (antiresonance frequency) at which infinitely large impedance is exhibited.

In ladder-type piezoelectric resonator filters, there have conventionally been proposed techniques for broadening the pass band of a filter by employing an output section which is common to one parallel piezoelectric resonator and another parallel piezoelectric resonator and is grounded via an inductor component (see Japanese Laid-Open Patent Publication No. 2003-298392, paragraphs 0044-0052, and FIGS. 13 to 18; and Japanese Laid-Open Patent Publication No. 2004-112277, FIG. 1). FIG. 23 is a diagram illustrating a conventional ladder-type piezoelectric resonator filter in which a common output section is employed for all parallel piezoelectric resonators and grounded via an inductor component (see Japanese Laid-Open Patent Publication No. 2003-298392, paragraphs 0044-0052, and FIGS. 13 to 18). As shown in FIG. 23, in the conventional ladder-type piezoelectric resonator filter, a common output section is employed for each of parallel piezoelectric resonators $102a$ to $102d$, and grounded via an inductor component 103. FIG. 24 is a diagram illustrating an exemplary structure of another conventional ladder-type piezoelectric resonator filter (see Japanese Laid-Open Patent Publication No. 2004-112277, FIG. 1). As shown in FIG. 24, in this conventional ladder-type piezoelectric resonator filter, a common output section is employed for two parallel piezoelectric resonators $102b$ and $102c$ which are not directly connected to input and output terminals, and grounded via an inductor component $103b$. The output sections of the other parallel piezoelectric resonators $102a$ and $102d$ are grounded via inductor components $103a$ and $103c$, respectively.

In the case where a piezoelectric resonator filter is employed in the transmitting end of an antenna duplexer, a filter is required whose characteristics allow any signal in the transmitting-end frequency band to pass therethrough while blocking any signal in the receiving-end frequency band, so that little loss is incurred in the transmitting-end frequency band and that a large attenuation amount (crossband attenuation amount) in the receiving-end frequency band is obtained. Similarly, in the case where a piezoelectric resonator filter is employed in the receiving end of an antenna duplexer, a filter is required whose characteristics allow any signal in the receiving-end frequency band to pass therethrough while blocking any signal in the transmitting-end frequency band, so that little loss is incurred in the receiving-end frequency band and that a large attenuation amount (crossband attenuation amount) in the transmitting-end frequency band is obtained.

FIG. 25 is a graph illustrating passing characteristics for an input signal against frequency in the conventional piezoelectric resonator filter shown in FIG. 23. FIG. 26 is a graph illustrating passing characteristics for an input signal against frequency in the conventional piezoelectric resonator filter shown in FIG. 24. In FIGS. 25 and 26, it is assumed that, given a center frequency fc of the pass band, the pass band is in the range from 0.985×fc to 1.015×fc, and that the stop band is in the range from 1.082×fc to 1.113×fc. For example, in the case where the piezoelectric resonator filter is used as a Tx-end filter in an antenna duplexer, the pass band shown in FIG. 25 or 26 will correspond to a transmission band, and the stop band shown in FIG. 25 or 26 will correspond to a reception band.

The characteristics shown in FIGS. 25 and 26 were obtained under the following conditions for a center frequency fc: each of the serial piezoelectric resonators $101a$ to $101c$ has a resonance frequency which is equal to about fc±1.5%; each of the serial piezoelectric resonators $101a$ to $101c$ has an antiresonance frequency which is equal to about (fc±1.5%)+2%; each of the parallel piezoelectric resonators $102a$ to $102d$ has a resonance frequency which is equal to about (fc±1.5%)−2%; and each of the parallel piezoelectric resonators $102a$ to $102d$ has an antiresonance frequency which is equal to about fc±1.5%. The inductors 13 (FIG. 23), $13a$, $13b$, and $13c$ (FIG. 24) had a self-inductance of 1 nH or less. The center frequency fc was in the range of 500 MHz to 10 GHz. Although the above-described conditions are also used in the description of the embodiments of the present invention (described later) for comparative purposes, it is not intended that the pass band width, stop band width, pass band frequency, and stop band frequency be limited to the above-described conditions in the embodiments of the present invention described later.

In the characteristics shown in FIG. 25, the piezoelectric resonator filter of FIG. 23 had an insertion loss of −1.88 dB. In the characteristics shown in FIG. 26, the piezoelectric resonator filter of FIG. 24 had an insertion loss of −1.82 dB.

As described above, in a conventional piezoelectric resonator filter, a common output section is employed for adjoining parallel piezoelectric resonators, and the commonly-connected parallel piezoelectric resonators are grounded via a common inductor component, in an attempt to broaden the pass band of the filter. However, although the conventional technique may be able to realize a broad band, there is a problem in that it is difficult to reduce the insertion loss while maintaining a sufficient attenuation amount for the stop band. Note that, when the effects of the present invention are to be illustrated in comparison with a conventional example, the conventional example shown in FIG. 24 will be used because the conventional example shown in FIG. 24 incurs less insertion loss between the aforementioned two conventional examples.

SUMMARY OF THE INVENTION

Therefore, an object of the present invention is to provide a piezoelectric resonator filter which only presents a low insertion loss while securing satisfactory characteristics in the stop band.

To achieve the above objects, the present invention has the following aspects. A first aspect of the present invention is directed to a piezoelectric resonator filter for allowing a high-frequency signal in a desired frequency band to pass therethrough, comprising two or more reactance elements with a serial connection between an input terminal and an output terminal and at least three or more piezoelectric resonators with a parallel connection between the input terminal and the output terminal, the two or more reactance elements and the three or more piezoelectric resonators being disposed in a ladder connection. In the piezoelectric resonator filter, at least two non-adjoining piezoelectric resonators among the three or more piezoelectric resonators share a common electrode, the common electrode being opposite to electrodes which are connected to the two or more reactance elements, and the shared common electrode is grounded via an inductor component.

According to the first aspect of the present invention, non-adjoining piezoelectric resonators which are connected in parallel between input and output terminals are grounded via a common inductor. As a result, there is provided a piezoelectric resonator filter such that the insertion loss in the pass band is reduced from the conventional level, while maintaining an attenuation amount which compares to the conventional level in the stop band.

Preferably, among the three or more piezoelectric resonators, at least one piezoelectric resonator which is interposed between the at least two non-adjoining piezoelectric resonators sharing the common electrode has an electrode connected between two adjoining ones among the two or more reactance elements.

Thus, the piezoelectric resonator filter includes a T-type circuit between two non-adjoining piezoelectric resonators.

For example, at least one of the two or more reactance elements is a piezoelectric resonator.

For example, at least one of the two or more reactance elements is a surface acoustic wave filter.

For example, at least one of the two or more reactance elements is a capacitor or an inductor.

Preferably, among the at least two non-adjoining piezoelectric resonators sharing the common electrode, one piezoelectric resonator has an electrode connected to the input terminal, and another piezoelectric resonator has an electrode connected to the output terminal.

Thus, endmost piezoelectric resonators are grounded via a common inductor, so that the insertion loss is reduced even more effectively.

A second aspect of the present invention is directed to a piezoelectric resonator filter for allowing a high-frequency signal in a desired frequency band to pass therethrough, comprising three or more reactance elements having a serial connection between an input terminal and an output terminal and at least four or more piezoelectric resonators having a parallel connection between the input terminal and the output terminal, the three or more reactance elements and the four or more piezoelectric resonators being disposed in a ladder connection. In the piezoelectric resonator filter, among the four or more piezoelectric resonators, at least two non-adjoining piezoelectric resonators are included in a first filter group. Among the piezoelectric resonators not included in the first filter group, at least two non-adjoining piezoelectric resonators are included in a second filter group. The at least two non-adjoining piezoelectric resonators in the first filter group share a common electrode which is grounded via a first inductor component, the common electrode being opposite to electrodes which are connected to the three or more reactance elements. The at least two non-adjoining piezoelectric resonators in the second filter group share a common electrode which is grounded via a second inductor component, the common electrode being opposite to electrodes which are connected to the three or more reactance elements.

According to the second aspect of the present invention, the insertion loss is more reduced than conventionally.

Preferably, at least one piezoelectric resonator in the first filter group has an electrode connected to the input terminal or the output terminal.

Preferably, one piezoelectric resonator in the first filter group has an electrode connected to the input terminal, and one piezoelectric resonator in the second filter group has an electrode connected to the output terminal.

A third aspect of the present invention is directed to a piezoelectric resonator filter for allowing a high-frequency signal in a desired frequency band to pass therethrough, comprising three or more reactance elements having a serial connection between an input terminal and an output terminal and at least four or more piezoelectric resonators having a parallel connection between the input terminal and the output terminal, the three or more reactance elements and the four or more piezoelectric resonators being disposed in a ladder connection. In the piezoelectric resonator filter, among the four or more piezoelectric resonators, at least two non-adjoining piezoelectric resonators are included in a filter group. The at least two non-adjoining piezoelectric resonators in the filter group share a common electrode which is connected to a first inductor component, the common electrode being opposite to electrodes which are connected to the three or more reactance elements, and the first inductor component and at least one piezoelectric resonator not included in the filter group are grounded via a second inductor component.

According to the third aspect of the present invention, the insertion loss is more reduced than conventionally.

A fourth aspect of the present invention is directed to a duplexer including a transmission filter for allowing a signal in a transmission band to pass therethrough and attenuating a signal in a reception band, and a reception filter for allowing a signal in the reception band to pass therethrough and attenuating a signal in the transmission band. The transmission filter and/or the reception filter is a piezoelectric resonator filter for allowing a high-frequency signal in a desired frequency band to pass therethrough, including two or more reactance elements having a serial connection between an input terminal and an output terminal and at least three or more piezoelectric resonators having a parallel connection between the input terminal and the output terminal, the two or more reactance elements and the three or more piezoelectric resonators being disposed in a ladder connection. At least two non-adjoining piezoelectric resonators among the three or more piezoelectric resonators share a common electrode, the common electrode being opposite to electrodes which are connected to the two or more reactance elements. The shared common electrode is grounded via an inductor component.

A fifth aspect of the present invention is directed to a duplexer including a transmission filter for allowing a signal in a transmission band to pass therethrough and attenuating a signal in a reception band, and a reception filter for allowing a signal in the reception band to pass therethrough and attenuating a signal in the transmission band. The transmission filter and/or the reception filter is a piezoelectric resonator filter for allowing a high-frequency signal in a desired frequency band to pass therethrough, including three or more reactance elements having a serial connection between an input terminal and an output terminal and at least four or more piezoelectric resonators having a parallel connection between the input terminal and the output terminal, the three or more reactance elements and the four or more piezoelectric resonators being disposed in a ladder connection. Among the four or more piezoelectric resonators, at least two non-adjoining piezoelectric resonators are included in a first filter group. Among the piezoelectric resonators not included in the first filter group, at least two non-adjoining piezoelectric resonators are included in a second filter group. The at least two non-adjoining piezoelectric resonators in the first filter group share a common electrode which is grounded via a first inductor component, the common electrode being opposite to electrodes which are connected to the three or more reactance elements. The at least two non-adjoining piezoelectric resonators in the second filter group share a common electrode which is grounded via a second inductor component, the common electrode being opposite to electrodes which are connected to the three or more reactance elements.

A sixth aspect of the present invention is directed to a duplexer including a transmission filter for allowing a signal in a transmission band to pass therethrough and attenuating a signal in a reception band, and a reception filter for allowing a signal in the reception band to pass therethrough and attenuating a signal in the transmission band. The transmission filter and/or the reception filter is a piezoelectric resonator filter for allowing a high-frequency signal in a desired frequency band to pass therethrough, including three or more reactance elements having a serial connection between an input terminal and an output terminal and at least four or more piezoelectric resonators having a parallel connection between the input terminal and the output terminal. The three or more reactance elements and the four or more piezoelectric resonators being disposed in a ladder connection. Among the four or more piezoelectric resonators, at least two non-adjoining piezoelectric resonators are included in a filter group. The at least two non-adjoining piezoelectric resonators in the filter group share a common electrode which is connected to a first inductor component, the common electrode being opposite to electrodes which are connected to the three or more reactance elements. The first inductor component and at least one piezoelectric resonator not included in the filter group are grounded via a second inductor component.

A seventh aspect of the present invention is directed to a communication device including a filter, the filter being a piezoelectric resonator filter for allowing a high-frequency signal in a desired frequency band to pass therethrough, including two or more reactance elements having a serial connection between an input terminal and an output terminal and at least three or more piezoelectric resonators having a parallel connection between the input terminal and the output terminal. The two or more reactance elements and the three or more piezoelectric resonators being disposed in a ladder connection. The at least two non-adjoining piezoelectric resonators among the three or more piezoelectric resonators share a common electrode, the common electrode being opposite to electrodes which are connected to the two or more reactance elements. The shared common electrode is grounded via an inductor component.

An eighth aspect of the present invention is directed to a communication device comprising a filter, the filter being a piezoelectric resonator filter for allowing a high-frequency signal in a desired frequency band to pass therethrough, including three or more reactance elements having a serial connection between an input terminal and an output terminal and at least four or more piezoelectric resonators having a parallel connection between the input terminal and the output terminal. The three or more reactance elements and the four or more piezoelectric resonators being disposed in a ladder connection. Among the four or more piezoelectric resonators, at least two non-adjoining piezoelectric resonators are included in a first filter group. Among the piezoelectric resonators not included in the first filter group, at least two non-adjoining piezoelectric resonators are included in a second filter group. The at least two non-adjoining piezoelectric resonators in the first filter group share a common electrode which is grounded via a first inductor component, the common electrode being opposite to electrodes which are connected to the three or more reactance elements. The at least two non-adjoining piezoelectric resonators in the second filter group share a common electrode which is grounded via a second inductor component, the common electrode being opposite to electrodes which are connected to the three or more reactance elements.

A ninth aspect of the present invention is directed to a communication device comprising a filter, the filter being a piezoelectric resonator filter for allowing a high-frequency signal in a desired frequency band to pass therethrough, including three or more reactance elements having a serial connection between an input terminal and an output terminal and at least four or more piezoelectric resonators having a parallel connection between the input terminal and the output terminal. The three or more reactance elements and the four or more piezoelectric resonators being disposed in a ladder connection. Among the four or more piezoelectric resonators, at least two non-adjoining piezoelectric resonators are included in a filter group. The at least two non-adjoining piezoelectric resonators in the filter group share a common electrode which is connected to a first inductor component, the common electrode being opposite to electrodes which are connected to the three or more reactance elements. The first inductor component and at least one piezoelectric resonator not included in the filter group are grounded via a second inductor component.

These and other objects, features, aspects and advantages of the present invention will become more apparent from the following detailed description of the present invention when taken in conjunction with the accompanying drawings.

DETAILED DESCRIPTION OF THE INVENTION

First Embodiment

Figure 1:
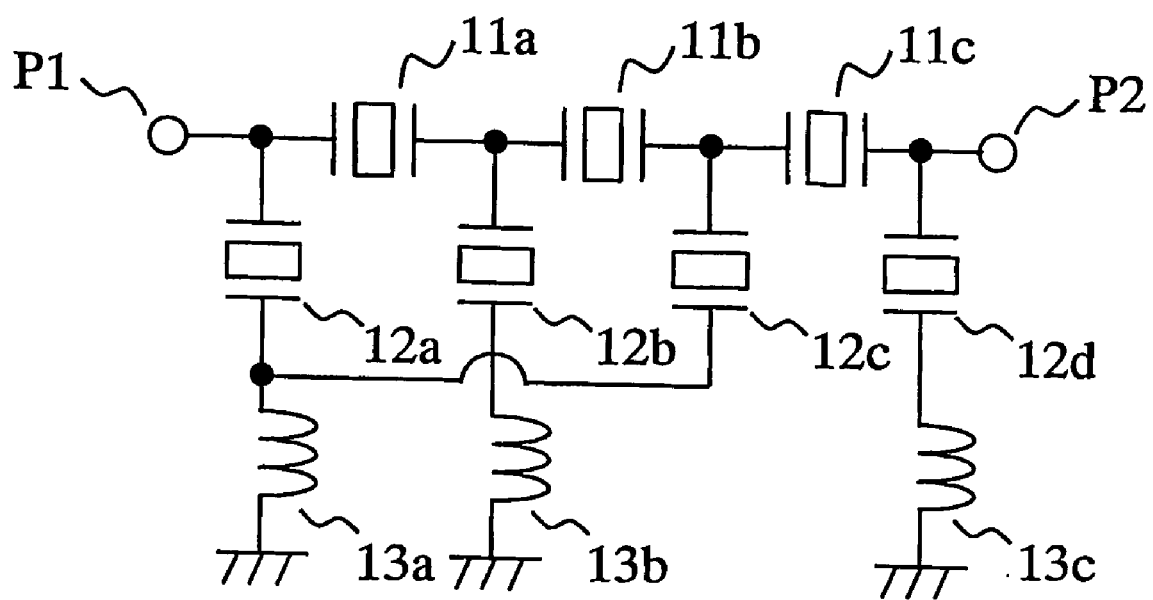
FIG. 1 is a diagram showing an equivalent circuit of a piezoelectric resonator filter according to a first embodiment of the present invention.

FIG. 1 is a diagram showing an equivalent circuit of a piezoelectric resonator filter according to a first embodiment of the present invention. In FIG. 1, the piezoelectric resonator filter comprises: three piezoelectric resonators 11 (hereinafter referred to as "serial piezoelectric resonators 11") having a serial connection between an input terminal P1 and an output terminal P2; four piezoelectric resonators 12 (hereinafter referred to as "parallel piezoelectric resonators 12") having a parallel connection between the input terminal P1 and the output terminal P2; and inductors 13a, 13b, and 13c, each of which is grounded at one end. In FIG. 1, the serial piezoelectric resonators 11 are labeled as serial piezoelectric resonators 11a to 11c for distinction. Otherwise, the serial piezoelectric resonators may collectively be referred to as "serial piezoelectric resonators 11" when there is no need for distinction. Similarly, in FIG. 1, the parallel piezoelectric resonators 12 are labeled as parallel piezoelectric resonators 12a to 12d for distinction. Otherwise, the parallel piezoelectric resonator may collectively be referred to as "parallel piezoelectric resonators 12" when there is no need for distinction.

Each of the serial piezoelectric resonators 11 and the parallel piezoelectric resonators 12 is a resonator which has such impedance characteristics that the resonator has both a resonance point and an antiresonance point, e.g., a thin film piezoelectric resonator (FBAR: Film Bulk Acoustic Resonator) or a SAW (Surface Acoustic Wave resonator) resonator.

As shown in FIG. 1, the parallel piezoelectric resonator 12a is connected in parallel between the input terminal P1 and the serial piezoelectric resonator 11a. The parallel piezoelectric resonator 12b is provided having a parallel connection between the serial piezoelectric resonator 11a and the serial piezoelectric resonator 11b. The parallel piezoelectric resonator 12c is connected in parallel between the serial piezoelectric resonator 11b and the serial piezoelectric resonator 11c. The parallel piezoelectric resonator 12d is connected in parallel between the serial piezoelectric resonator 11c and the output terminal P2. In other words, the serial piezoelectric resonators 11 and the parallel piezoelectric resonators 12 are interconnected so as to constitute a n type ladder filter. Since the filter shown in FIG. 1 includes seven piezoelectric resonators, it will be referred to as a "7-staged ladder filter" herein. Similarly, a filter composed of n piezoelectric resonators (where n is an integer equal to or greater than 2) which are provided in a ladder connection will be referred to as an "n-staged ladder filter".

The parallel piezoelectric resonator 12a and the parallel piezoelectric resonator 12c are grounded via the common inductor 13a. The parallel piezoelectric resonator 12b is grounded via the inductor 13b. The parallel piezoelectric resonator 12d is grounded via the inductor 13c.

Figure 2:
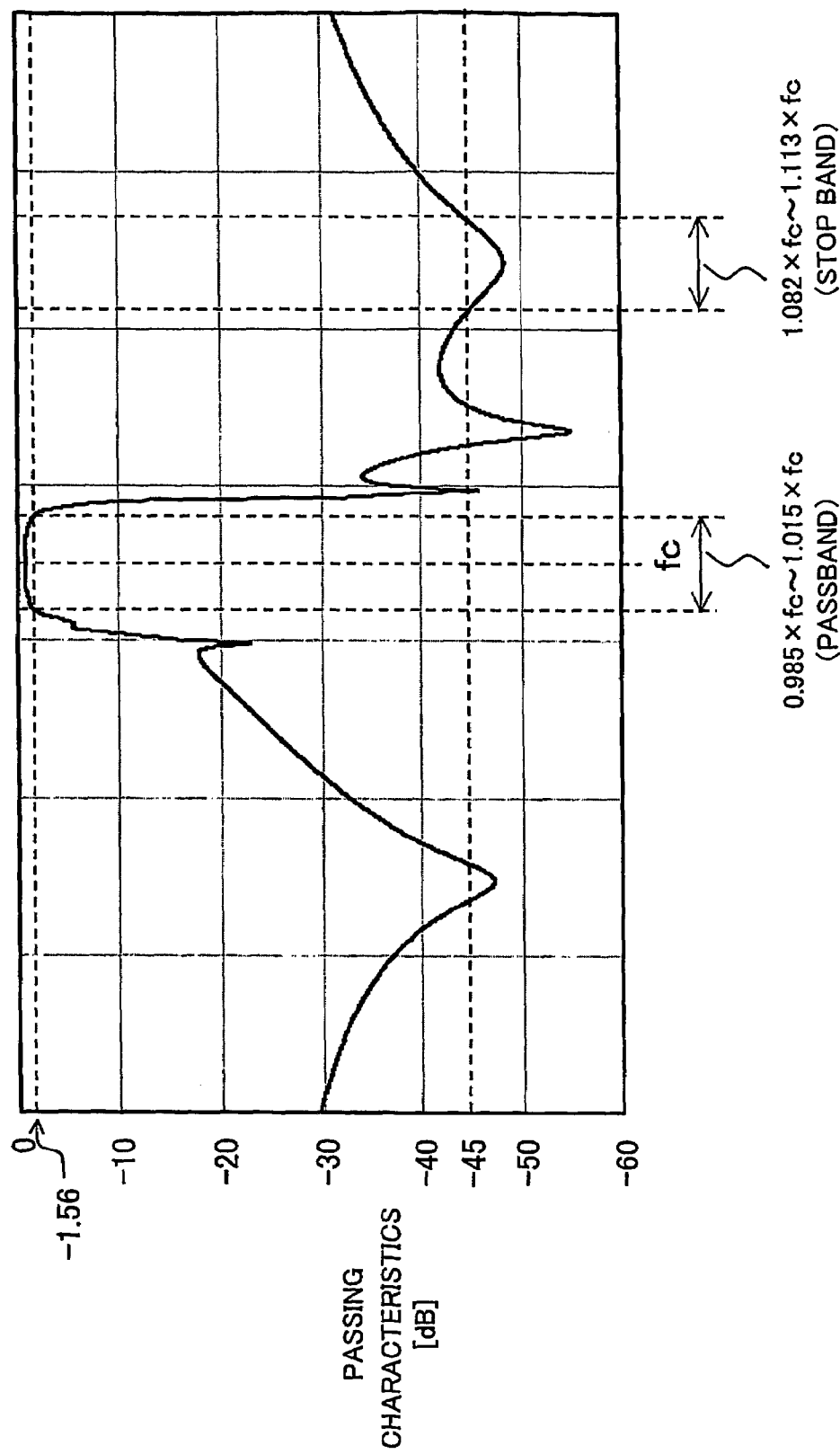
FIG. 2 is a graph illustrating passing characteristics for an input signal against frequency in the piezoelectric resonator filter (FIG. 1) according to the first embodiment.

FIG. 2 is a graph illustrating passing characteristics for an input signal against frequency in the piezoelectric resonator filter (FIG. 1) according to the first embodiment. In FIG. 2, it is assumed that, given a center frequency fc of the pass band, the pass band is in the range from 0.985×fc to 1.015×fc, and that the stop band is in the range from 1.082×fc to 1.113×fc. For example, in the case where the piezoelectric resonator filter of the first embodiment is used as a Tx-end filter in an antenna duplexer, the pass band shown in FIG. 2 will correspond to a transmission band, and the stop band shown in FIG. 2 will correspond to a reception band.

Figure 26:
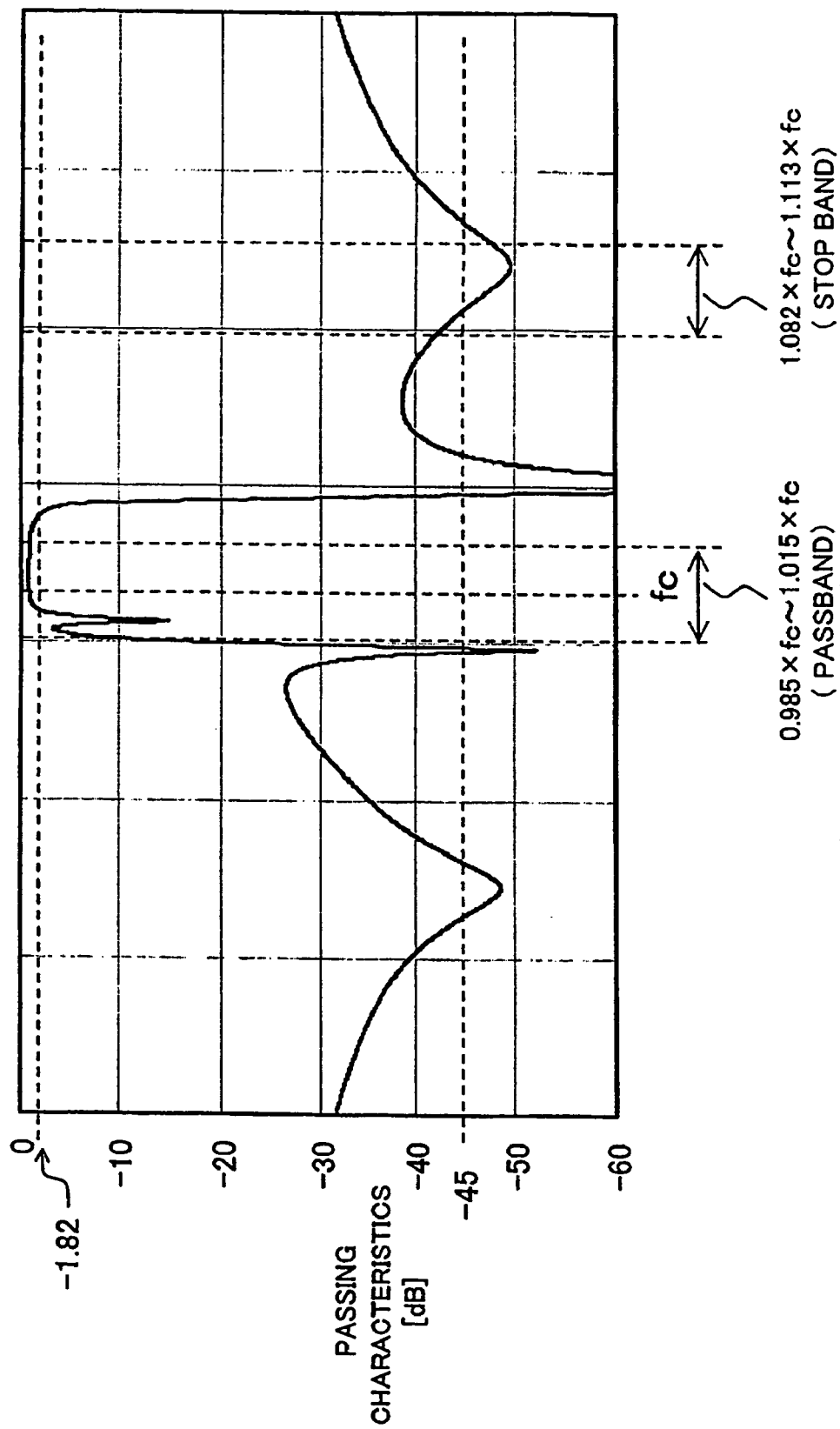
FIG. 26 is a graph illustrating passing characteristics for an input signal against frequency in the conventional piezoelectric resonator filter shown in FIG. 24.

As seen from FIG. 2, the piezoelectric resonator filter of the first embodiment has an insertion loss of about −1.56 dB, thus indicating an about −0.26 dB improvement in insertion loss relative to the conventional case (FIG. 26).

Moreover, as shown in FIG. 2, the piezoelectric resonator filter of the first embodiment attains an attenuation amount of about −45 dB or less in the stop band, as does the conventional piezoelectric resonator filter. Thus, it can be seen that the piezoelectric resonator filter of the first embodiment is able to provide a sufficient signal attenuation in the stop band.

Thus, according to the first embodiment, there is provided a piezoelectric resonator filter in which non-adjoining parallel piezoelectric resonators are grounded via a common inductor, such that the insertion loss in the pass band is reduced from the conventional level, while maintaining an attenuation amount which compares to the conventional level in the stop band.

Although the first embodiment illustrates an example where the parallel piezoelectric resonators 12a and 12c are grounded via a common inductor, it is also envisaged that the parallel piezoelectric resonators 12b and 12d may be grounded via a common inductor, and the parallel piezoelectric resonators 12a and 12d may be grounded via a common inductor. In other words, effects of the present invention can be obtained as long as at least two non-adjoining parallel piezoelectric resonators are grounded via a common inductor.

Figure 3:
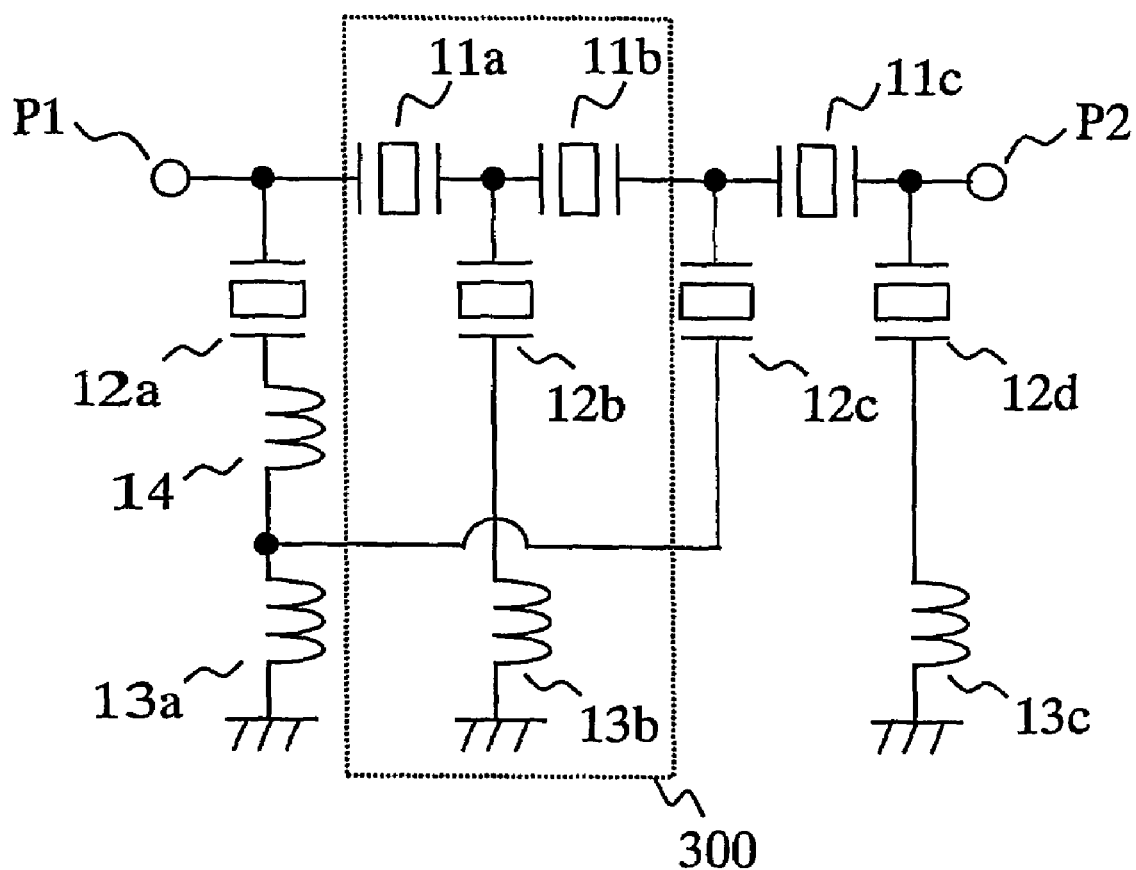
FIG. 3 is a diagram illustrating a first variant of the piezoelectric resonator filter according to the first embodiment.

FIG. 3 is an equivalent circuit diagram illustrating a piezoelectric resonator filter based on the piezoelectric resonator filter shown in FIG. 1, where an inductor 14 is connected between the common inductor 13a and the parallel piezoelectric resonator 12a (which is one of the parallel piezoelectric resonators composing a common connection). The piezoelectric resonator filter has shown such characteristics that there is an insertion loss of −1.56 dB. Thus, even in the case where the inductor 14 is connected in this fashion, effects of the present invention can be obtained as long as non-adjoining parallel piezoelectric resonators are grounded via a common inductor.

Figure 4:
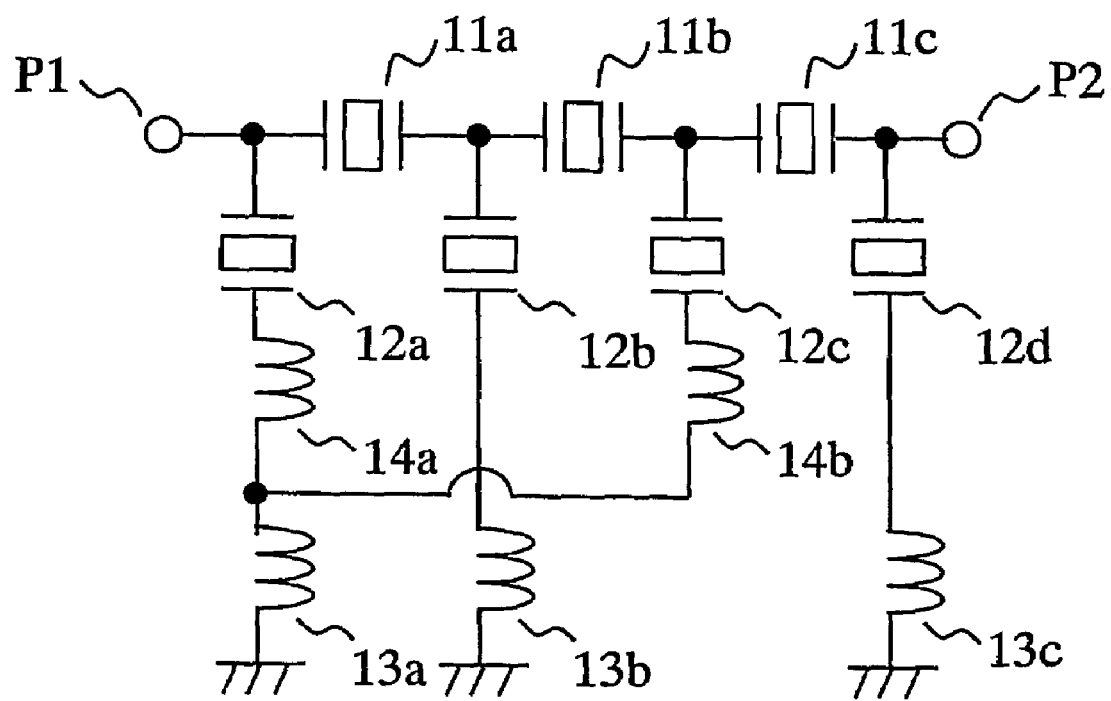
FIG. 4 is a diagram illustrating a second variant of the piezoelectric resonator filter according to the first embodiment.

Furthermore, FIG. 4 is an equivalent circuit diagram illustrating a piezoelectric resonator filter based on the piezoelectric resonator filter shown in FIG. 1, where an inductor 14a is connected between the common inductor 13a and the parallel piezoelectric resonator 12a (which is one of the parallel piezoelectric resonators composing a common connection) and an inductor 14b is connected between the common inductor 13a and the parallel piezoelectric resonator 12c (which is the other parallel piezoelectric resonator composing the common connection). The piezoelectric resonator filter has shown such characteristics that there is an insertion loss of −1.56 dB. Thus, even in the case where the inductors 14a and 14b are connected in this fashion, effects of the present invention can be obtained as long as non-adjoining parallel piezoelectric resonators are grounded via a common inductor.

Thus, it has been found that the effect of insertion loss reduction can be obtained as long as at least two non-adjoining parallel piezoelectric resonators are grounded via a common inductor.

Although the first embodiment illustrates an example of employing a 7-staged ladder filter, it will be appreciated that the present embodiment is applicable to any ladder filter comprising at least three parallel piezoelectric resonators. In other words, as long as at least two non-adjoining parallel piezoelectric resonators are grounded via a common inductor, the present invention is not limited to a 7-staged ladder filter.

Figure 5A:
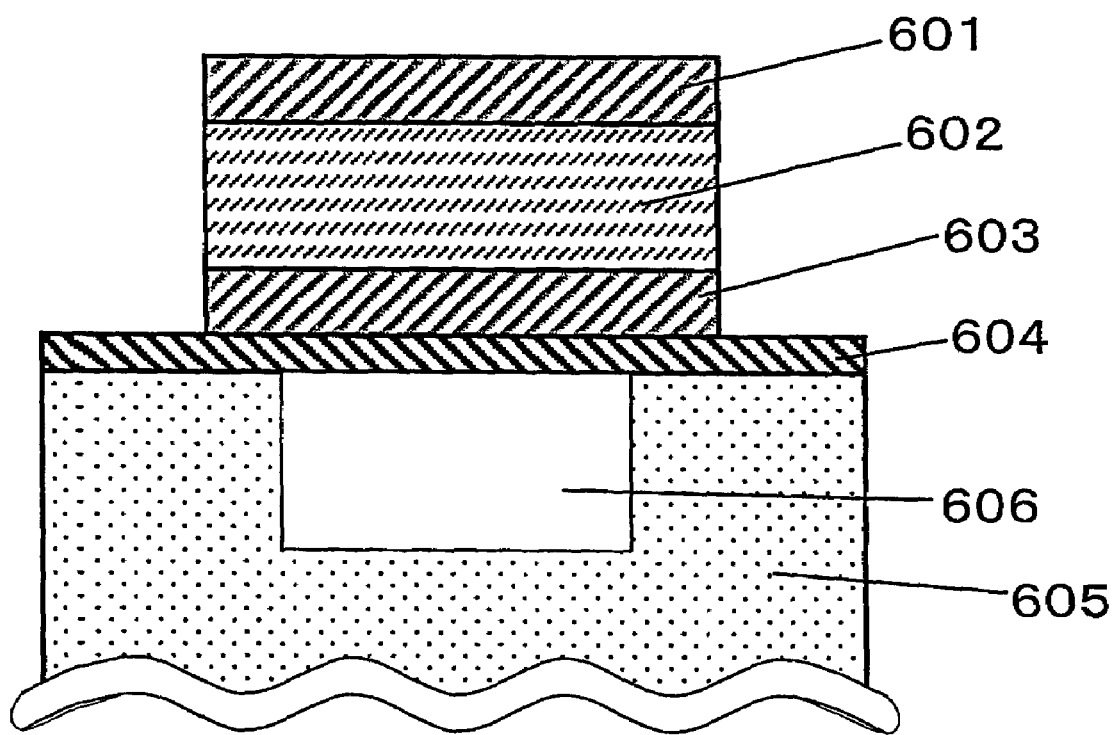
FIG. 5A is a diagram illustrating a cross-sectional structure of a cavity-type FBAR.
Figure 5B:
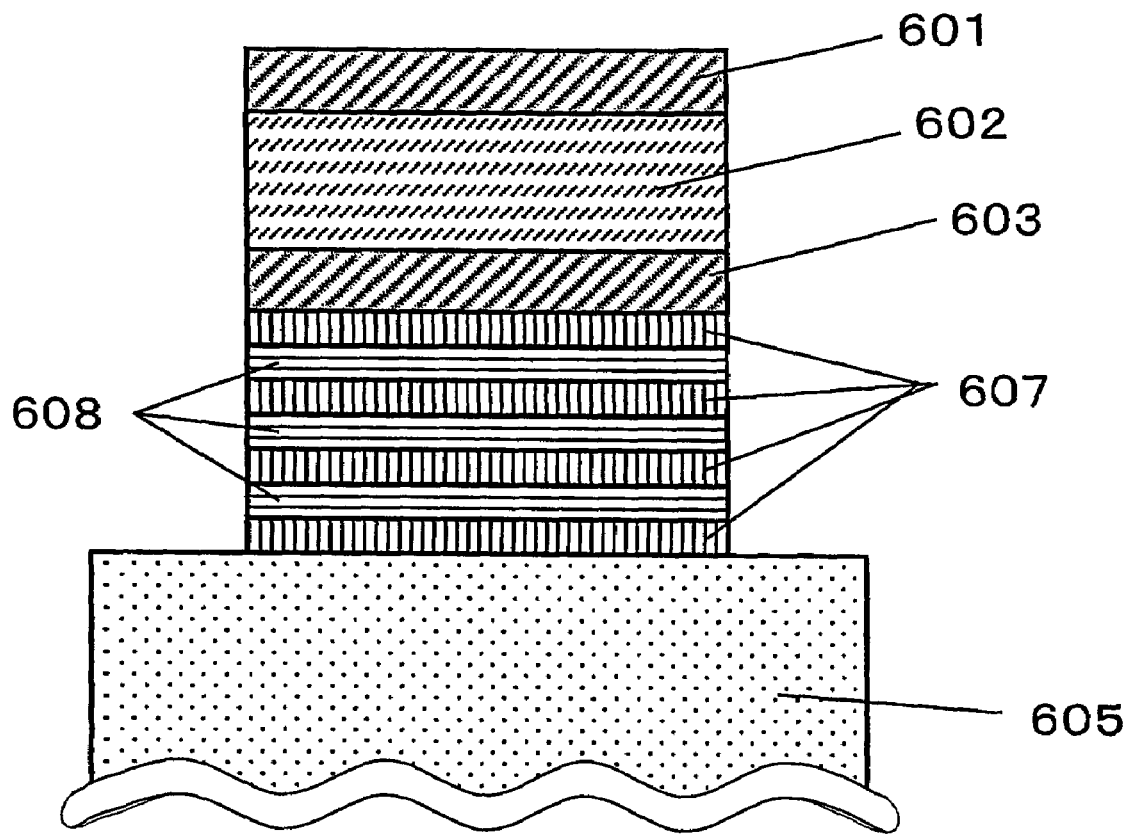
FIG. 5B is a diagram illustrating a cross-sectional structure of a mirror-structure-type FBAR.
Figure 5C:
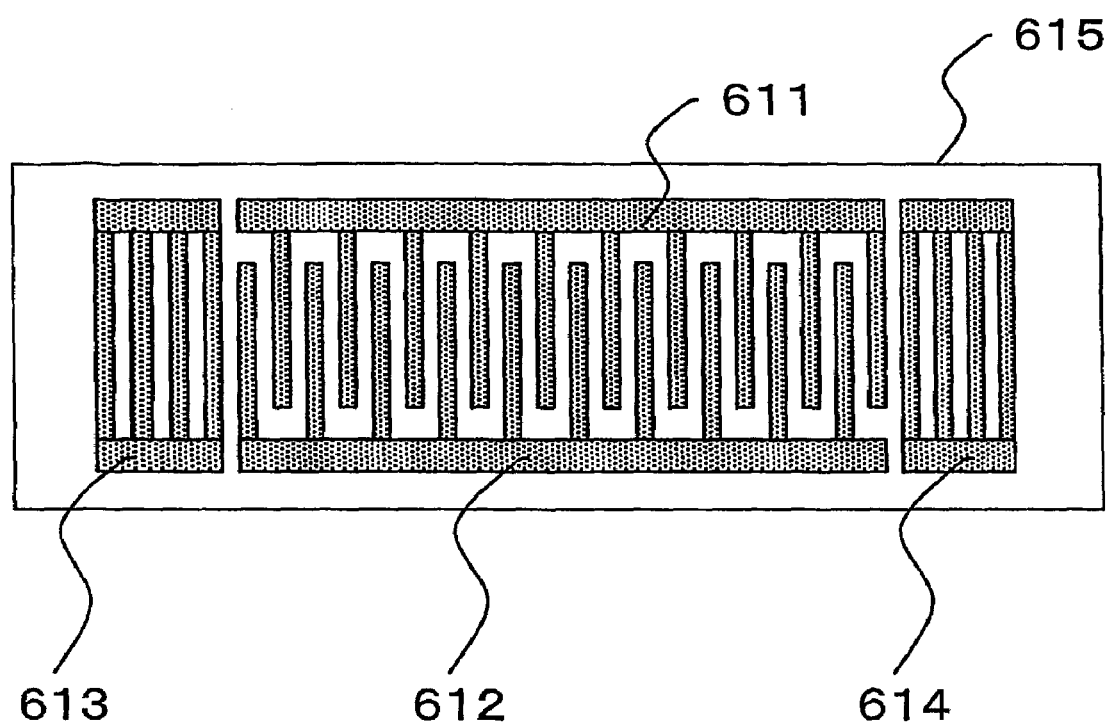
FIG. 5C is a diagram showing a SAW resonator.

In the first embodiment, as each piezoelectric resonator, a cavity-type thin film piezoelectric resonator as that shown in FIG. 5A, a mirror-structure-type thin film piezoelectric resonator as that shown in FIG. 5B, a surface acoustic wave resonator (SAW resonator) as that shown in FIG. 5C, or the like may be used.

Hereinafter, a cavity-type FBAR structure as shown in FIG. 5A will be described. As shown in FIG. 5A, a cavity-type FBAR is composed of: an upper electrode layer 601 of Mo, Pt, Al, Cu, Au, W, or the like; a piezoelectric layer 602 of AlN, ZnO, PZT, PbTiO$_3$, or the like; a lower electrode layer 603 of Pt, Mo, Al, Cu, Au, W, or the like; an insulative layer 604 of SiO$_2$, SiN, or the like; a silicon substrate 605; and a cavity 606 formed in the silicon substrate 605.

Note that the area accounted for by a vibrating section which is composed of an upper electrode layer 601, the piezoelectric layer 602, the lower electrode layer 603, and the insulative layer 604 may differ from piezoelectric resonator to piezoelectric resonator. Furthermore, any layer other than the upper electrode layer 601 and the lower electrode layer 603 may be constructed as a single continuous layer across the piezoelectric resonators.

Just as the cavity may be of any shape, the electrode shape may be a round shape, a polygonal shape, a constricted shape, or any other shape, whereby similar effects can be obtained.

Hereinafter, as a structure in which no cavity is provided, a mirror-structure-type FBAR structure shown in FIG. 5B will be described. As shown in FIG. 5B, a vibrating section, which is composed of an upper electrode layer 601, a lower electrode layer 603, and a piezoelectric layer 602 interposed therebetween, is disposed on an acoustic multilayer film. An acoustic multilayer film is constructed on a substrate 605. The acoustic multilayer film is formed by alternately stacking low-acoustic impedance layers 607 each having a thickness of ¼ wavelength and high-acoustic impedance layers 608 each having a thickness of ¼ wavelength. By ensuring that the "first" layer in the acoustic multilayer film as seen from the vibrating section is a low impedance layer 607, the load impedance with respect to the piezoelectric layer 602 becomes sufficiently small. As a result, it becomes possible to acoustically isolate the piezoelectric layer 602 from the substrate 605. Based on such a structure, the vibrating section, although being fixed to the substrate 605, is capable of operating in a free-vibrating state (as if not supported by anything), thus exhibiting an operation similar to that of the FBAR shown in FIG. 5A. The vibrating section becomes more acoustically isolated from the substrate 605 as there are more layers of such low impedance layers 607 and high impedance layers 608 being stacked.

As the low impedance layer 607, materials such as silicon dioxide (SiO$_2$) or silicon nitride (Si$_3$N$_4$) are used. As the high impedance layer 608, materials such as aluminum nitride (AlN), zinc nitride (ZnO), molybdenum (Mo), hafnium oxide (HfO$_2$), titanium oxide (TiO$_2$), or zirconium oxide (ZrO$_2$) are used.

The layer structures shown in FIG. 5A and FIG. 5B are only exemplary. Similar effects can also be obtained when a thin piezoelectric layer is provided as a passivation film above the upper electrode, or when an insulative layer is provided between the piezoelectric layer and an electrode. The constituent elements of the present invention are not limited to those shown in FIG. 5A or FIG. 5B.

In the vibrating section composed of the upper electrode layer 601, the piezoelectric layer 602, and the lower electrode layer 603, the areas of the upper electrode layer 601, the piezoelectric layer 602, and the lower electrode layer 603 may be different from one another. Furthermore, any layer other than the upper electrode layer 601 and the lower electrode layer 603 may be constructed as a single continuous layer shared with the other piezoelectric resonators.

Just as the cavity may be of any shape, the electrode shape may be a round shape, a polygonal shape, a constricted shape, or any other shape, whereby similar effects can be obtained.

Hereinafter, a SAW resonator structure shown in FIG. 5C will be described. As shown in FIG. 5C, a SAW resonator is composed of: comb-like electrodes 611 and 612 defining input and output sections; reflective plates 613 and 614 disposed on both sides of the comb-like electrodes 611 and 612; and a substrate 615 lying beneath the electrodes 611 and 612 and the reflective plates 613 and 614.

Figure 6A:
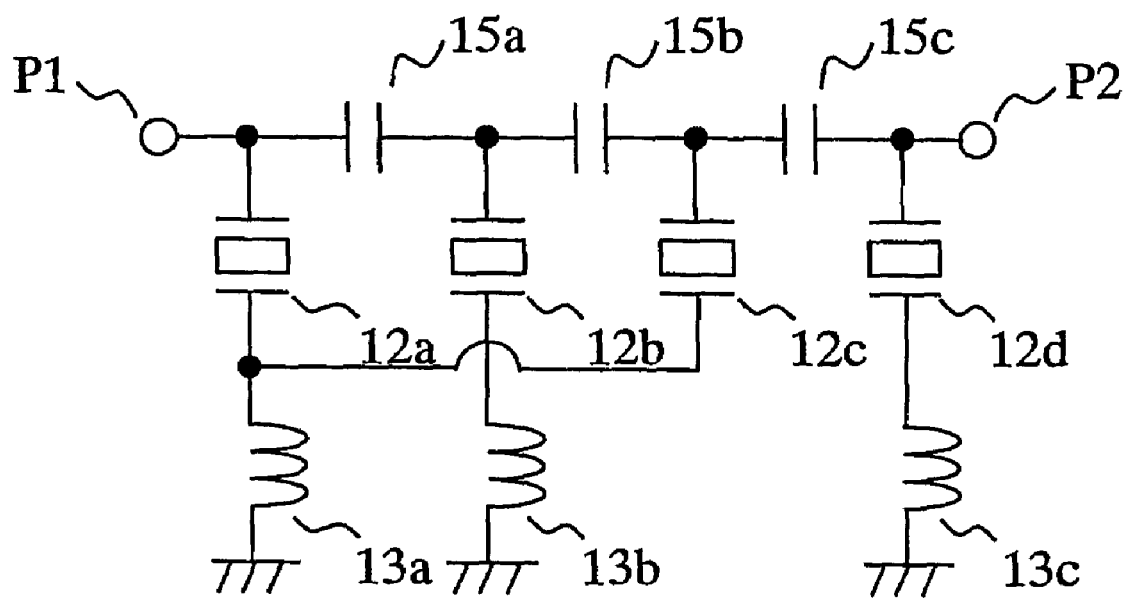
FIG. 6A is a diagram showing a structure in which capacitors 15a, 15b, and 15c are used as reactance elements of a serial portion of the piezoelectric resonator filter according to the first embodiment.

In the piezoelectric resonator filter shown in FIG. 1, instead of piezoelectric resonators, reactance elements such as capacitors may be employed in the serial portion interconnecting the input terminal P1 and the output terminal P2. FIG. 6A is an equivalent circuit showing a structure in which capacitors 15a, 15b, and 15c are used for the serial portion interconnecting the input terminal P1 and the output terminal P2. By omitting a cavity in a thin film piezoelectric resonator, one can obtain a capacitor.

Figure 6B:
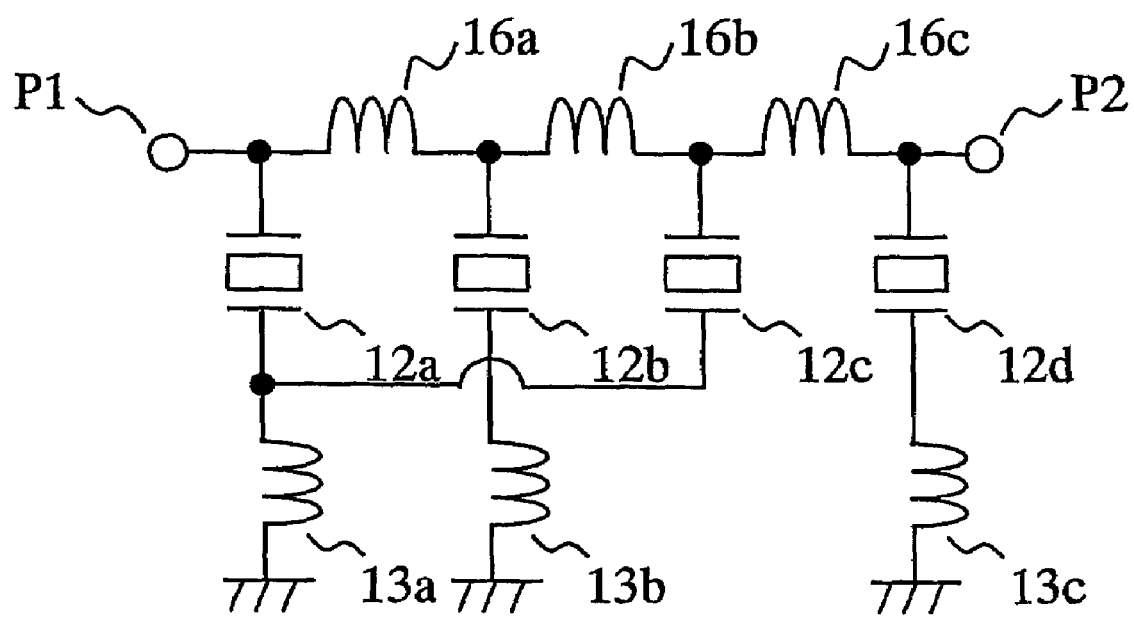
FIG. 6B is a diagram showing a structure in which capacitors 16a, 16b, and 16c are used as reactance elements in a serial portion of the piezoelectric resonator filter according to the first embodiment.

Note that, in the piezoelectric resonator filter shown in FIG. 1, instead of piezoelectric resonators, reactance elements such as inductors may be employed in the serial portion interconnecting the input terminal P1 and the output terminal P2, piezoelectric resonator. FIG. 6B is an equivalent circuit showing a structure in which inductors 16a, 16b, and 16c are used for the serial portion interconnecting the input terminal P1 and the output terminal P2. An inductor can be constructed by using electrode wiring, wires, or the like.

According to the present invention, at least one T-type circuit must be included between the two nodes at which the two commonly-connected parallel piezoelectric resonators are connected to the series arm interconnecting the input and output sections of the piezoelectric resonator filter. A "T-type circuit" is, as shown by a portion 300 enclosed in a dotted line in FIG. 3, a circuit which is composed of a serial piezoelectric resonator 11a, a serial piezoelectric resonator 11b, and a parallel piezoelectric resonator 12b which is connected between the serial piezoelectric resonator 11a and the serial piezoelectric resonator 11b. An inductor 13b may or may not be included in the T-type circuit 300. Generally speaking, a "ladder filter" is a filter including repetitions of circuits, each circuit being composed of elements which are connected in serial between the input and output terminals and elements which are connected in parallel between the input and output terminals. In a ladder filter, a "series arm" refers to an element which is connected in serial between the input and output terminals, whereas a "parallel arm" refers to an element which is connected in parallel between the input and output terminals.

In the first embodiment, all inductors to be used have a self-inductance of 1 nH or less. This is so that the inductors can be provided by simply connecting the parallel piezoelectric resonators to ground by means of wires, chip wiring, external inductors, package wiring, or the like. Thus, the filter can be downsized.

Second Embodiment

Figure 7:
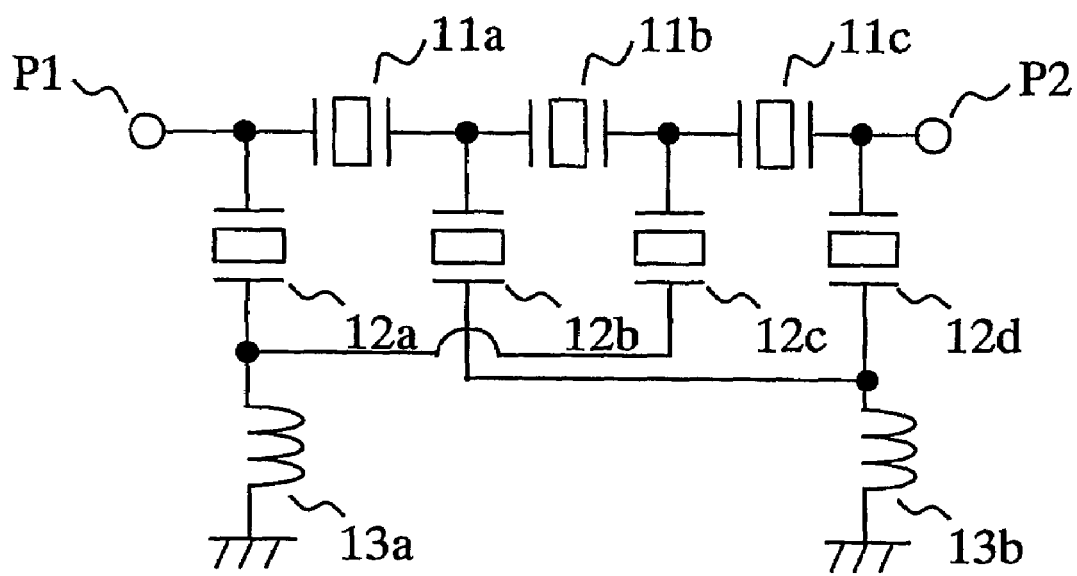
FIG. 7 is a diagram showing an equivalent circuit of a piezoelectric resonator filter according to a second embodiment of the present invention.

FIG. 7 is a diagram showing an equivalent circuit of a piezoelectric resonator filter according to a second embodiment of the present invention. In FIG. 7, the connections between serial piezoelectric resonators 11 and parallel piezoelectric resonators 12 are the same as those in the first embodiment. Thus, like numerals are used for like elements, the descriptions thereof being omitted. In a piezoelectric resonator filter including three or more serial piezoelectric resonators and four or more parallel piezoelectric resonators, at least two non-adjoining parallel piezoelectric resonators among the three or more parallel piezoelectric resonators are referred as a "first filter group"; and among those parallel piezoelectric resonators which are not included in the first filter group, at least two non-adjoining parallel piezoelectric resonators are referred to as a "second filter group". In the present embodiment, the parallel piezoelectric resonators 12a and 12c are included in the first filter group. The parallel piezoelectric resonators 12b and 12c are included in the second filter group.

As shown in FIG. 7, in the second embodiment, parallel piezoelectric resonators which do not adjoin each other are grounded via a common inductor. Specifically, the parallel piezoelectric resonators 12a and 12c are grounded via a common inductor 13a, and parallel piezoelectric resonators 12b and 12d are grounded via a common inductor 13b. Thus, in the second embodiment, every other parallel piezoelectric resonator is grounded via a common inductor.

Under conditions similar to those used in the first embodiment, the piezoelectric resonator filter of the second embodiment (FIG. 7) has shown such characteristics that there is an insertion loss of about −1.55 dB in the pass band and an attenuation amount of about −45 dB in the stop band. Thus, an improvement in insertion loss of about −0.27 dB is obtained relative to the conventional case (FIG. 26).

Figure 8:
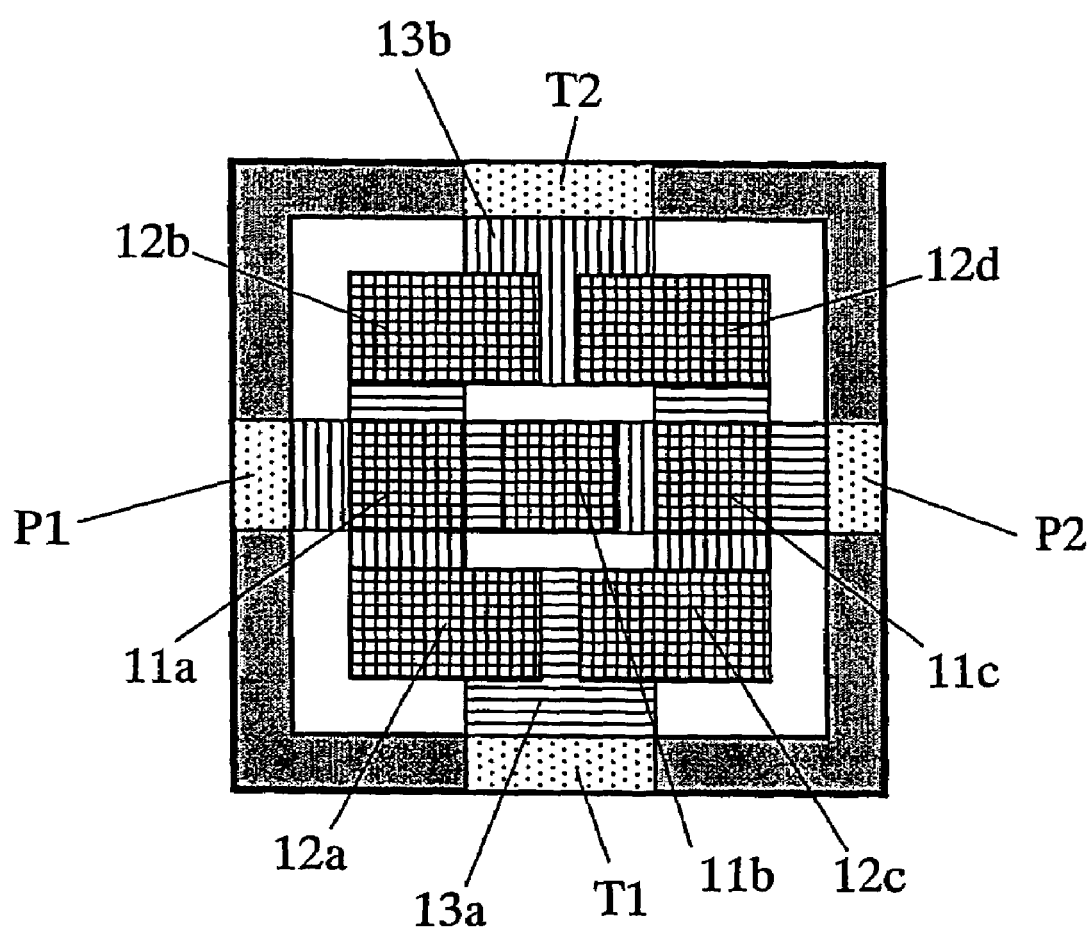
FIG. 8 is a diagram showing an exemplary wiring pattern for the circuit shown in FIG. 7 in the case where inductors 13a and 13b are implemented in the form of chip wiring.

FIG. 8 is a diagram showing an exemplary wiring pattern for the circuit shown in FIG. 7 in the case where the inductors 13a and 13b are implemented in the form of chip wiring. In FIG. 8, portions corresponding to the serial piezoelectric resonators 11a to 11c, parallel piezoelectric resonators 12a to 12d, the input terminal P1, and the output terminal P2 shown in FIG. 7 are denoted by the same reference numerals as those used therein. In FIG. 8, any region in which only a lower electrode layer wiring is provided is shown hatched with vertical lines; any region in which only an upper electrode layer wiring is provided is shown hatched with horizontal lines; and any region in which both upper and lower electrode layer wirings are provided is shown hatched with cross lines. As shown in FIG. 8, the upper electrodes of the parallel piezoelectric resonators 12a and 12c are implemented as a common electrode; and chip wiring 13a for this common electrode defines the inductor 13a. The chip wiring 13a is connected to a terminal T1, which in itself is grounded. Similarly, the lower electrodes of the parallel piezoelectric resonators 12b and 12d are implemented as a common electrode; and chip wiring 13b for this common electrode defines the inductor 13b. The chip wiring 13b is connected to a terminal T2, which in itself is grounded. Thus, by employing common chip wiring to implement the electrodes of parallel piezoelectric resonators which are grounded via a common inductor, and ensuring that the chip wiring has a sufficient size to possess an inductor component, it becomes possible to provide a common inductor within the filter package, thus making for downsizing.

Figure 9:
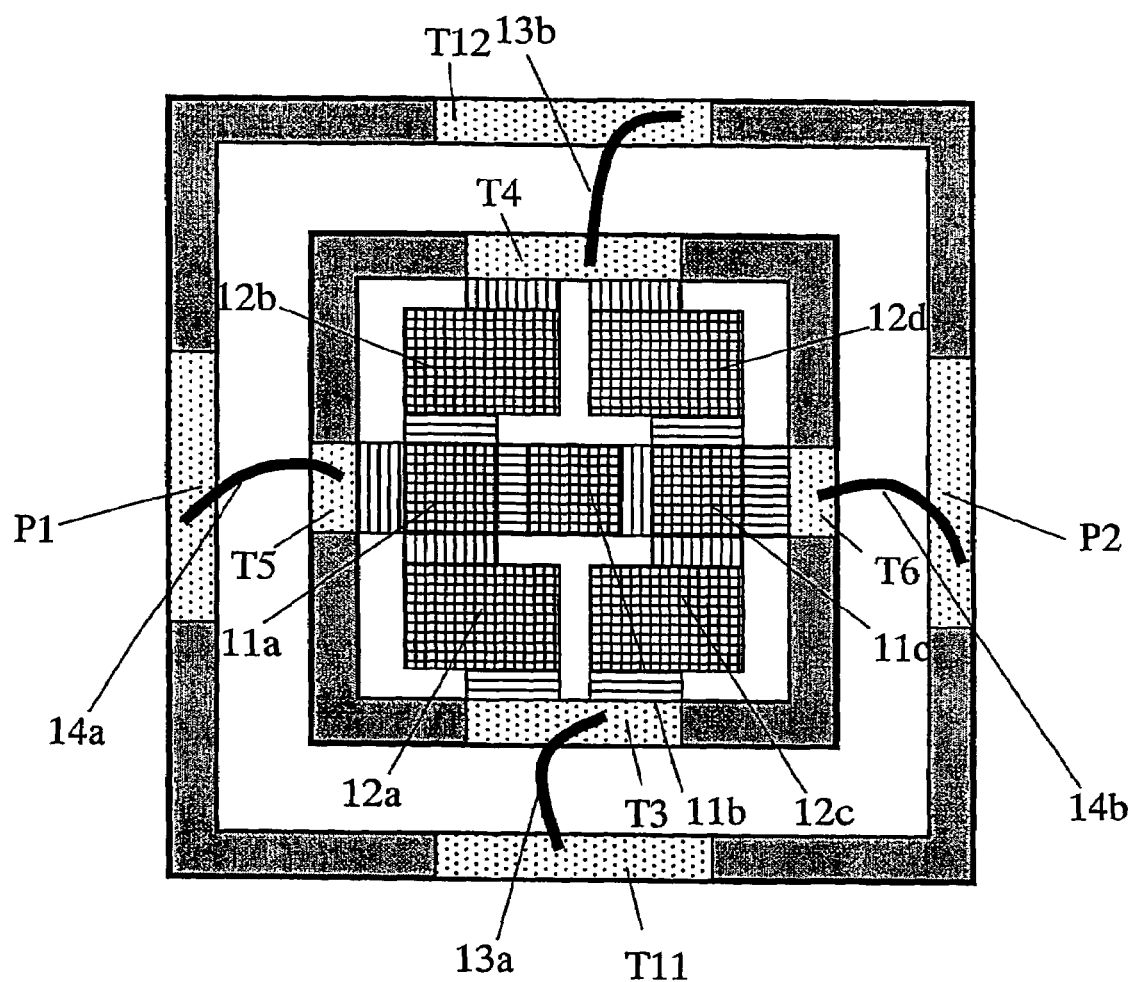
FIG. 9 is a diagram showing an exemplary wiring pattern in the case where inductors 13a and 13b are implemented in the form of wire inductors 13a and 13b.

FIG. 9 is a diagram showing an exemplary wiring pattern for the circuit shown in FIG. 7 in the case where the inductors 13a and 13b are implemented in the form of wires. As shown in FIG. 9, in the case where the filter is enclosed in a package, an inductor 14a is formed between the serial piezoelectric resonator 11a and the input terminal P1, and an inductor 14b is formed between the serial piezoelectric resonator 11c and the output terminal P2. Hereinafter, with respect to such a package, a structure for implementing the inductors 13a and 13b in the form of wires will be described.

In FIG. 9, the parallel piezoelectric resonators 12a and 12c are commonly connected to a terminal T3. Via a wire 13a, the terminal T3 is connected to a terminal T11, which in itself is grounded. Therefore, the wire 13a functions as the inductor 13a. Similarly, the parallel piezoelectric resonators 12b and 12d are commonly connected to a terminal T4. Via a wire 13b, the terminal T4 is connected to a terminal T12, which in itself is grounded. Therefore, the wire 13b functions as the inductor 13b. The input terminal P1 and the terminal T5 are interconnected via a wire 14a, and the output terminal P2 and the terminal T6 are interconnected via a wire 14b. Thus, the electrodes of parallel piezoelectric resonators which are grounded via a common inductor may be connected a terminal on the package by means of a common wire, whereby it becomes possible to provide a common inductor within the filter package, thus allowing downsizing.

Figure 10A:
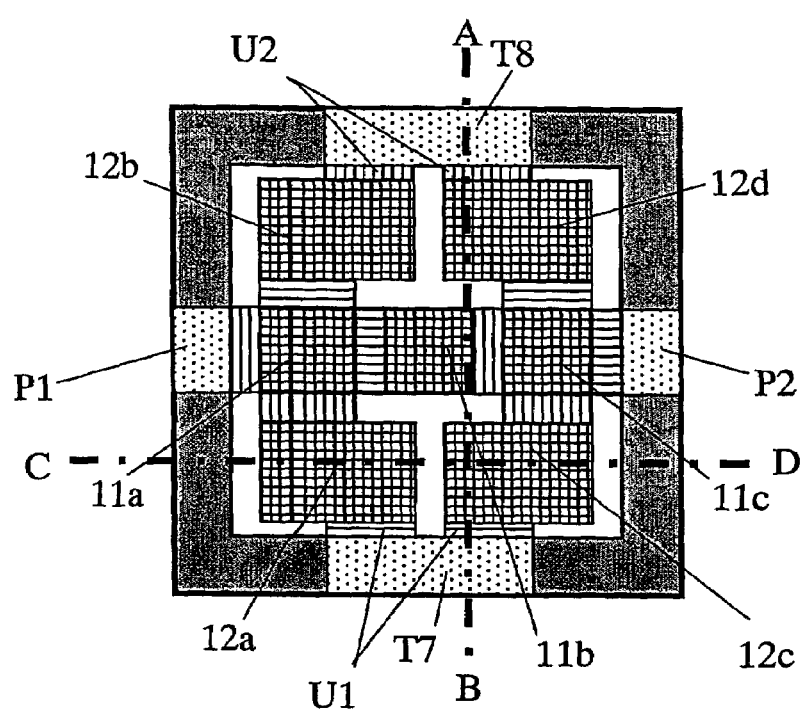
FIG. 10A is a diagram showing an exemplary wiring pattern in the case where the inductors 13a and 13b are implemented in the form of package wiring, illustrating an internal structure of the package as seen from above.
Figure 10C:
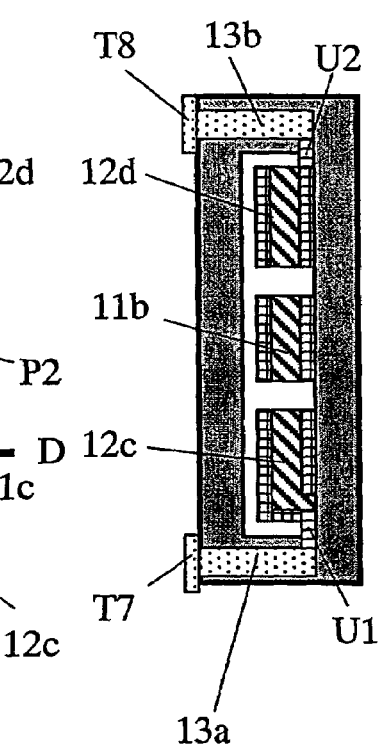
FIG. 10C is a cross-sectional view taken at line AB in FIG. 10A.
Figure 10B:
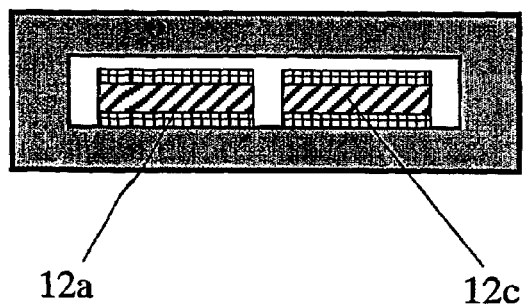
FIG. 10B is a cross-sectional view taken at line CD in FIG. 10A.

FIGS. 10A to 10C are diagrams showing an exemplary wiring pattern in the case where the inductors 13a and 13b are implemented in the form of package wiring. FIG. 10A illustrates the internal structure of the package as seen from above. FIG. 10B is a cross-sectional view taken at line CD. FIG. 10C is a cross-sectional view taken at line AB. As shown in FIG. 10A, the parallel piezoelectric resonators 12a and 12c are commonly connected to an upper electrode U1, and connected to a terminal T7 commonly via a piece of package wiring 13a (FIG. 10C). Thus, the piece of package wiring 13a functions as the inductor 13a. In FIG. 10C, the upper electrode U1 is shown to extend as low as the lower electrode of the parallel piezoelectric resonator 12c. However, since the upper electrode U1 is formed continuously from the upper electrode of the parallel piezoelectric resonator 12c, the upper electrode U1 will be referred to as an "upper electrode", regardless of its height. Similarly, the parallel piezoelectric resonators 12b and 12d are commonly connected to a lower electrode U2, and connected to a terminal T8 commonly via a piece of package wiring 13b (FIG. 10C). Thus, the piece of package wiring 13b functions as the inductor 13b. Thus, the electrodes of parallel piezoelectric resonators which are grounded via a common inductor may be connected to a terminal on the package by means of common package wiring, whereby it becomes possible to provide a common inductor within the filter package, thus allowing downsizing.

Figure 11A:
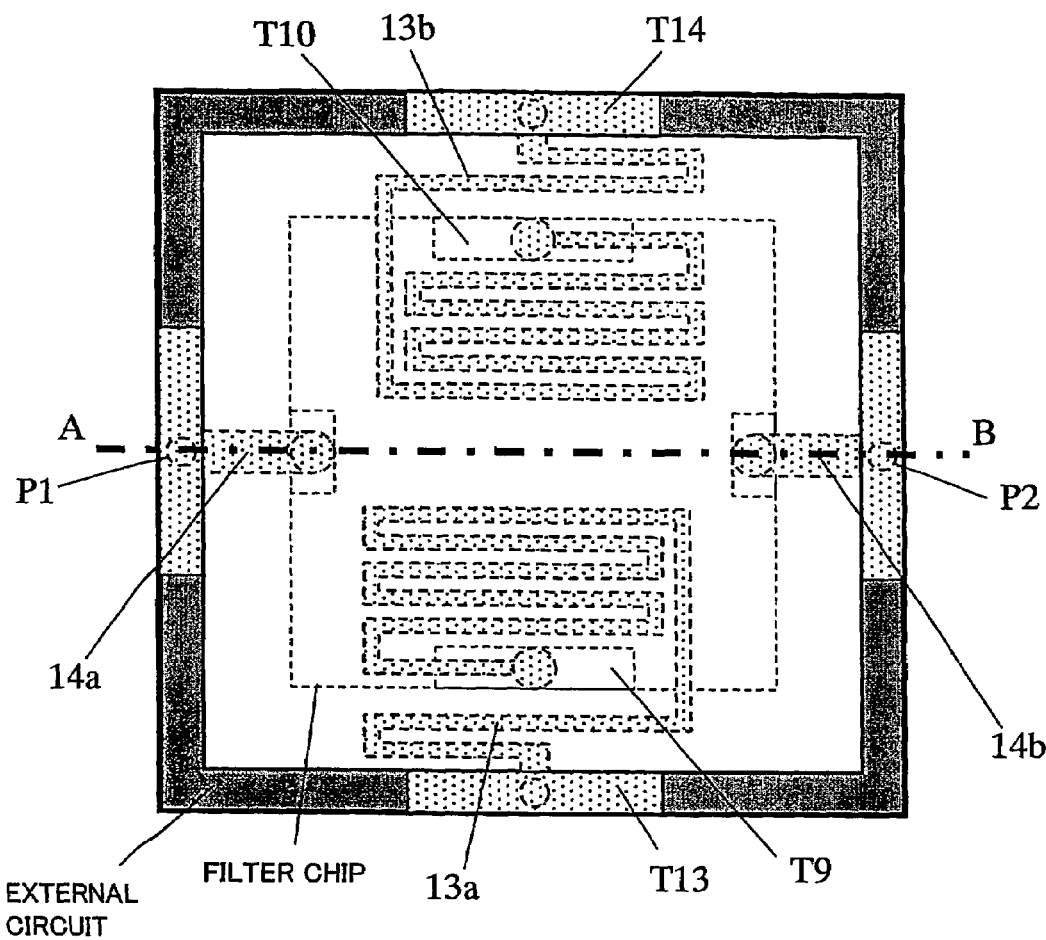
FIG. 11A is a diagram showing an exemplary wiring pattern in the case where the inductors 13a and 13b are implemented in the form of external inductors, illustrating an internal structure of the external circuit as seen from above.
Figure 11B:
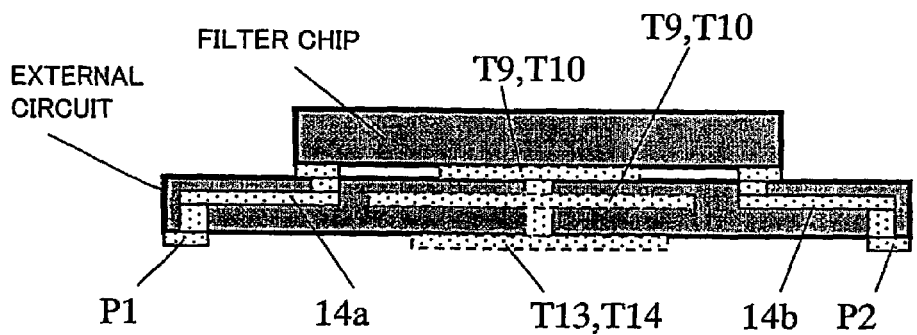
FIG. 11B is a cross-sectional view illustrating a packaged filter chip being mounted to an external circuit, taken at line AB in FIG. 11A.

FIG. 11A is a diagram showing an exemplary wiring pattern in the case where the inductors 13a and 13b are implemented in the form of inductors on an external circuit (hereinafter referred to as "external inductors"). FIG. 11A illustrates the internal structure of an external circuit. FIG. 11B is a cross-sectional view illustrating a packaged filter chip being mounted to the external circuit, taken at line AB. In FIG. 11B, the inductors 13a and 13b and terminals T9 and T10 are illustrated with dotted lines since they do not appear on the cross-section. It is assumed that, in the filter chip used herein, the parallel piezoelectric resonators 12a and 12c are commonly connected to a terminal T9, as in the case of FIG. 9. It is also assumed that the parallel piezoelectric resonators 12b and 12d are commonly connected to a terminal T10. As shown in FIGS. 11A and 11B, an end of the inductor 13a, which is provided internal to the external circuit, is connected to a terminal T13 which is formed on a lower face of the external circuit. The other end of the inductor 13a is connected to the terminal T9, which is formed on a lower face of the filter chip. An end of the inductor 13b, which is provided internal to the external circuit, is connected to a terminal T14 which is formed on the lower face of the external circuit. The other end of the inductor 13b is connected to the terminal T10, which is formed on the lower face of the filter chip. Furthermore, on the external circuit, an inductor 14a for connecting the input terminal P1 to the filter chip and an inductor 14b for connecting the output terminal P2 to the filter chip are formed. Thus, parallel piezoelectric resonators which are grounded via a common inductor may be grounded via a common external inductor.

In the second embodiment, the parallel piezoelectric resonator 12a and the parallel piezoelectric resonator 12c are grounded via the common inductor 13a. In the case where a wiring structure as shown in FIG. 8 is employed, the grounded side of the parallel piezoelectric resonator 12a is its upper electrode layer, and the grounded side of the parallel piezoelectric resonator 12c is also its upper electrode layer. In other words, the electrodes for being connected to the common inductor are in the same layer, so that these electrodes can be easily grounded via the common inductor.

Similarly, the grounded side of the parallel piezoelectric resonator 12b is its lower electrode layer, and the grounded side of the parallel piezoelectric resonator 12d is also its lower electrode layer. In other words, the electrodes for being connected to the common inductor are in the same layer, so that these electrodes can be easily grounded via the common inductor.

In a ladder filter employing FBARs as piezoelectric resonators, especially where a fundamental ladder structure including resonators in the order of parallel, serial, parallel, serial, etc., is employed as shown in FIG. 7, the grounded side of every other parallel piezoelectric resonator lies in the same layer. Therefore, the structure of the second embodiment, whose every other resonator is grounded via a common inductor, not only provides the effect of reducing insertion loss but also provides an advantage in that it is easy to make.

Figure 12:
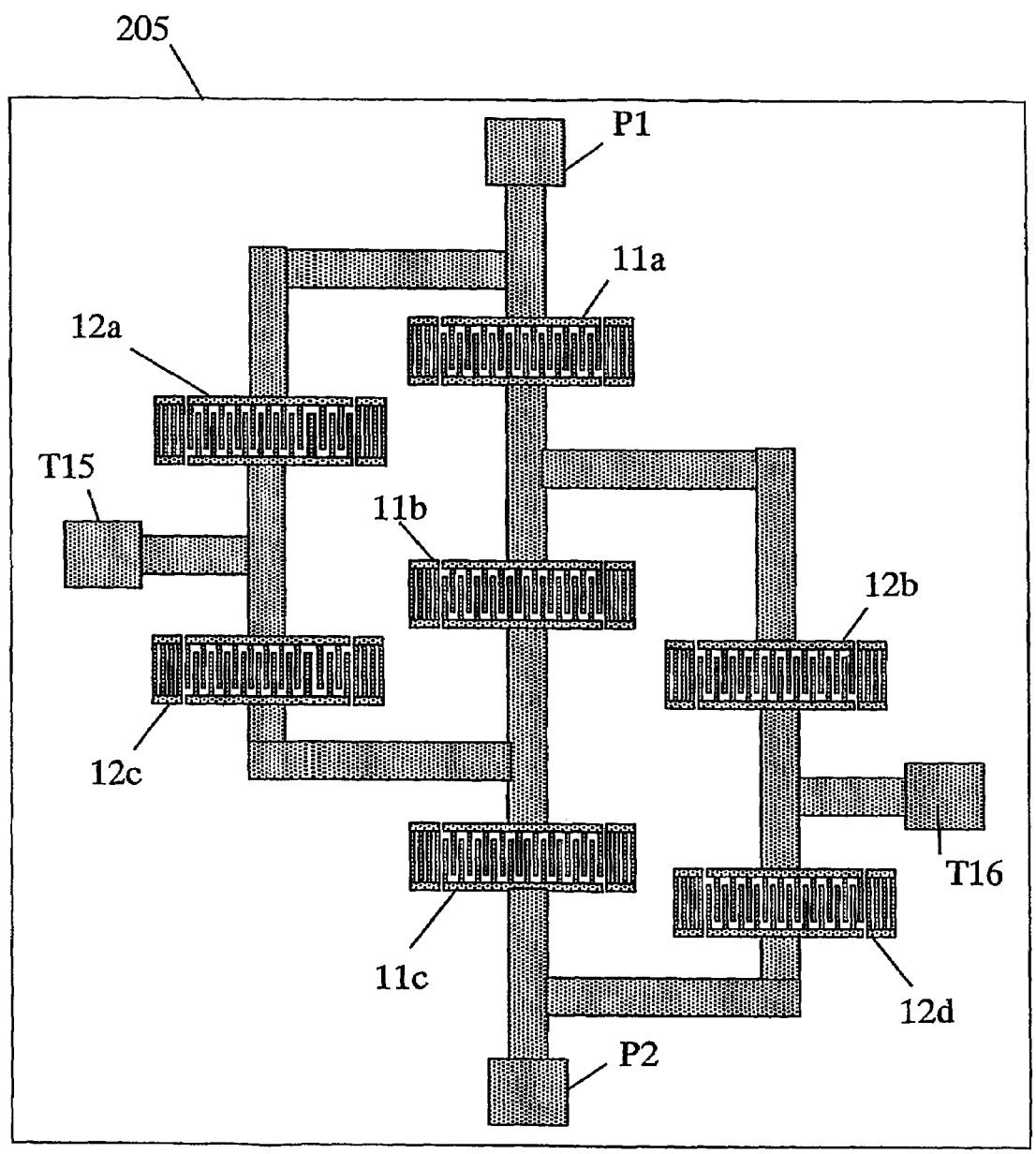
FIG. 12 is a diagram illustrating a case where SAW resonators are used as piezoelectric resonators in the circuit shown in FIG. 7.

FIG. 12 is a diagram illustrating an exemplary filter in the case where, in the circuit shown in FIG. 7, the piezoelectric resonators 11 and 12 are composed of SAW resonators such as that shown in FIG. 5C. In FIG. 12, each of the piezoelectric resonators 11 and 12 is connected by means of electrode wiring. The inductor 13a shown in FIG. 7 can be composed of a wire extending from T15 shown in FIG. 12. Similarly, the inductor 13b shown in FIG. 7 can be composed of a wire extending from T16 shown in FIG. 12. Thus, according to the second embodiment, it has been confirmed that FBARs or SAW resonators can be used for the piezoelectric resonators.

Although the second embodiment illustrates an example of employing a 7-staged ladder filter, it will be appreciated that the present embodiment is applicable to any ladder filter comprising at least three parallel piezoelectric resonators. In other words, as long as two non-adjoining parallel piezoelectric resonators are grounded via a common inductor, the present invention is not limited to a 7-staged ladder filter.

According to the present invention, at least one T-type circuit must be included between the two nodes at which the two commonly-connected parallel piezoelectric resonators are connected to the series arm interconnecting the input and output sections of the piezoelectric resonator filter. A "T-type circuit" is, as shown by a portion 300 enclosed in a dotted line in FIG. 3, a circuit which is composed of a serial piezoelectric resonator 11a, a serial piezoelectric resonator 11b, and a parallel piezoelectric resonator 12b which is connected between the serial piezoelectric resonator 11a and the serial piezoelectric resonator 11b. An inductor 13b may or may not be included in the T-type circuit 300.

In the second embodiment, all inductors to be used have a self-inductance of 1 nH or less. This is so that the inductors can be provided by simply connecting the parallel piezoelectric resonators to ground by means of wires, chip wiring, external inductors, package wiring, or the like. Thus, the filter can be downsized.

Third Embodiment

Figure 13:
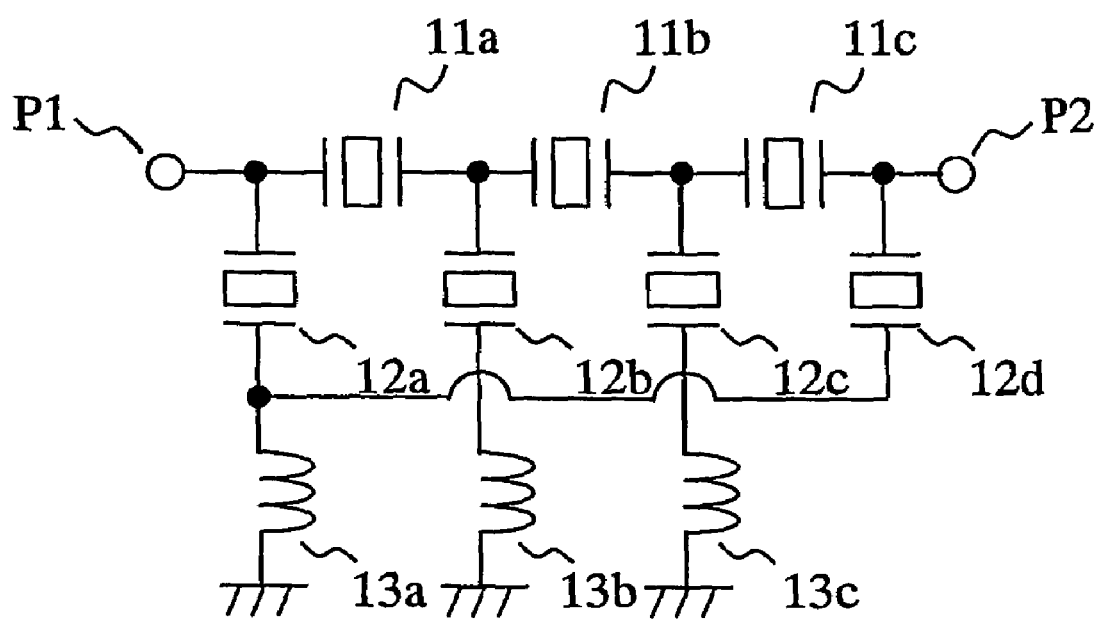
FIG. 13 is a diagram showing an equivalent circuit of a piezoelectric resonator filter according to a third embodiment of the present invention.

FIG. 13 is a diagram showing an equivalent circuit of a piezoelectric resonator filter according to a third embodiment of the present invention. In FIG. 13, the connections between serial piezoelectric resonators 11 and parallel piezoelectric resonators 12 are the same as those in the first embodiment. Thus, like numerals are used for like elements, the descriptions thereof being omitted.

As shown in FIG. 13, in the third embodiment, endmost parallel piezoelectric resonators 12a and 12d are grounded via a common inductor 13a. A parallel piezoelectric resonator 12b is grounded via an inductor 13b. A parallel piezoelectric resonator 12c is grounded via an inductor 13c.

Under conditions similar to those used in the first embodiment, the piezoelectric resonator filter of the third embodiment (FIG. 13) has shown such characteristics that there is an insertion loss of about −1.44 dB in the pass band and an attenuation amount of about −45 dB in the stop band. Thus, an improvement in insertion loss of about −0.38 dB is obtained relative to the conventional case (FIG. 26).

Thus, according to the third embodiment, by ensuring that the endmost parallel piezoelectric resonators are grounded via a common inductor, the insertion loss can be reduced even more effectively than in the cases of the first and second embodiments.

It is not essential to provide an inductor for the parallel piezoelectric resonators 12b and 12c, which are located more to the center than are the endmost parallel piezoelectric resonators 12a and 12d. In any other embodiment described herein, too, an inductor which alone is connected to a single parallel piezoelectric resonator does not need to exist. Thus, the effect of the present invention can be obtained without employing an inductor which alone is connected to a single parallel piezoelectric resonator.

Figure 14:
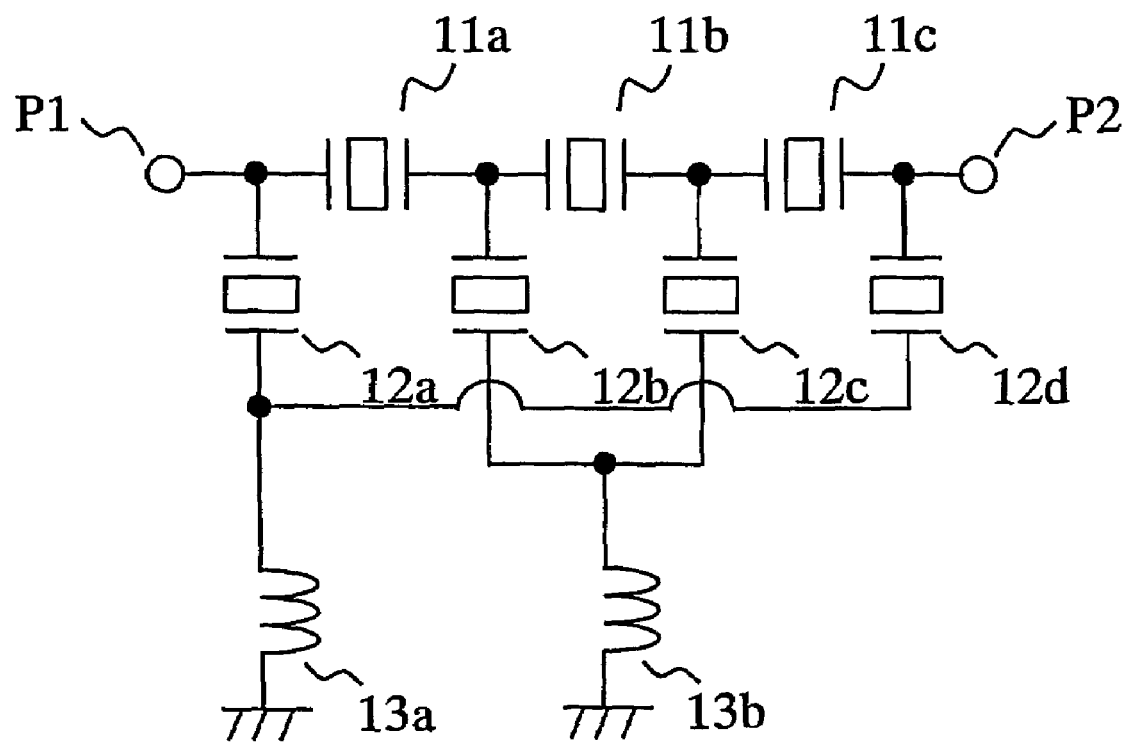
FIG. 14 is a diagram illustrating a first variant of the piezoelectric resonator filter according to the third embodiment.

As shown in FIG. 14, the output sections of the parallel piezoelectric resonators 12b and 12c, which are located more to the center than are the endmost parallel piezoelectric resonators 12a and 12d may be commonly connected and grounded via the common inductor 13b.

Figure 15:
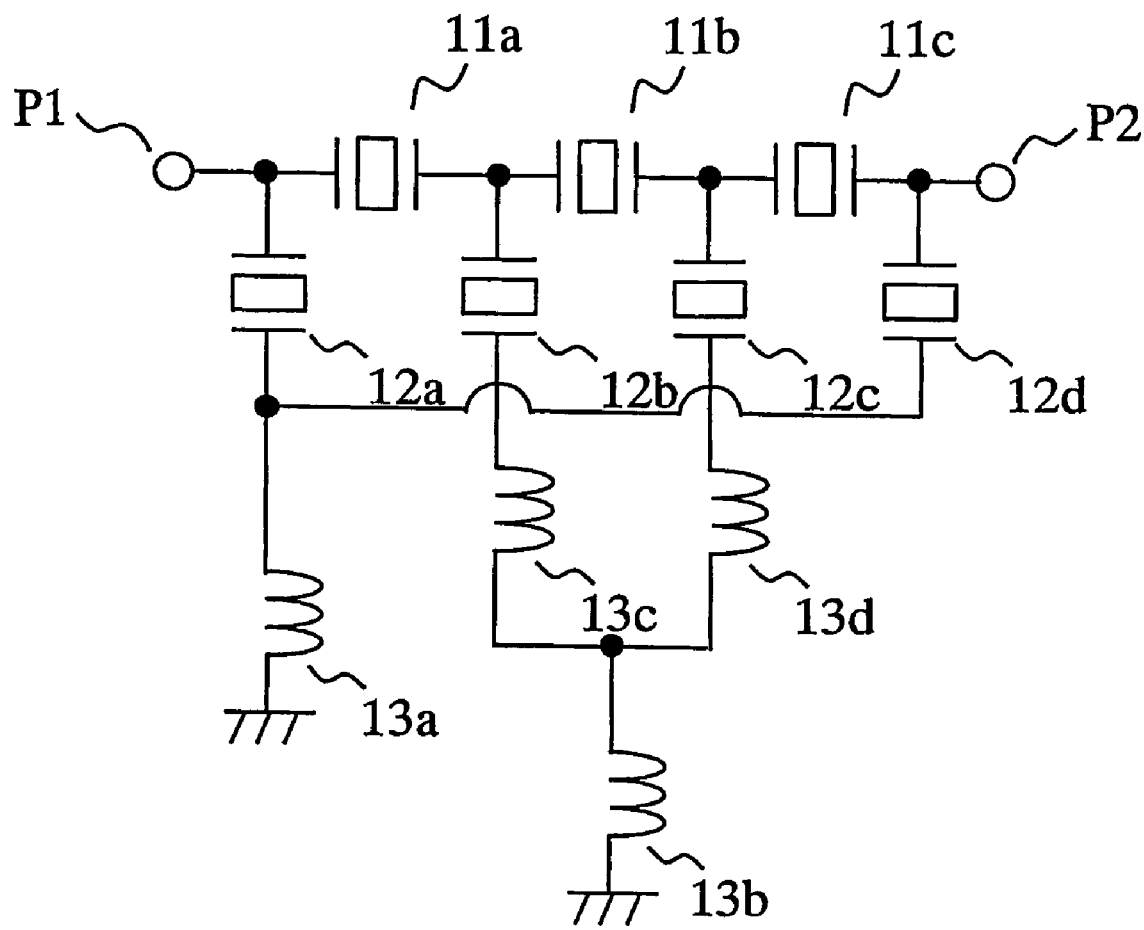
FIG. 15 is a diagram illustrating a second variant of the piezoelectric resonator filter according to the third embodiment.

As shown in FIG. 15, the output section of the parallel piezoelectric resonator 12b (which is located more to the center than are the endmost parallel piezoelectric resonators 12a and 12d) may be connected to the inductor 13c, and the output section of the parallel piezoelectric resonator 12c (which is also located more to the center than are the endmost parallel piezoelectric resonators 12a and 12d) may be connected to the inductor 13d, and the inductors 13c and 13d may be commonly connected and grounded via the common inductor 13b. In other words, as shown in FIGS. 13 to 15, as long as the endmost parallel piezoelectric resonators in the piezoelectric resonator filter are grounded via a common inductor, there is no limitation as to the manner of grounding the parallel piezoelectric resonators which are located more to the center than are the endmost parallel piezoelectric resonators.

It will be appreciated that the third embodiment is not limited to a 7-staged ladder filter as long as the endmost parallel piezoelectric resonators are grounded via a common inductor.

According to the present invention, at least one T-type circuit must be included between the two nodes at which the two commonly-connected parallel piezoelectric resonators are connected to the series arm interconnecting the input and output sections of the piezoelectric resonator filter. A "T-type circuit" is, as shown by a portion 300 enclosed in a dotted line in FIG. 3, a circuit which is composed of a serial piezoelectric resonator 11a, a serial piezoelectric resonator 11b, and a parallel piezoelectric resonator 12b which is connected between the serial piezoelectric resonator 11a and the serial piezoelectric resonator 11b. An inductor 13b may or may not be included in the T-type circuit 300.

In the third embodiment, all inductors to be used have a self-inductance of 1 nH or less. This is so that the inductors can be provided by simply connecting the parallel piezoelectric resonators to ground by means of wires, chip wiring, external inductors, package wiring, or the like. Thus, the filter can be downsized.

Fourth Embodiment

Figure 16:
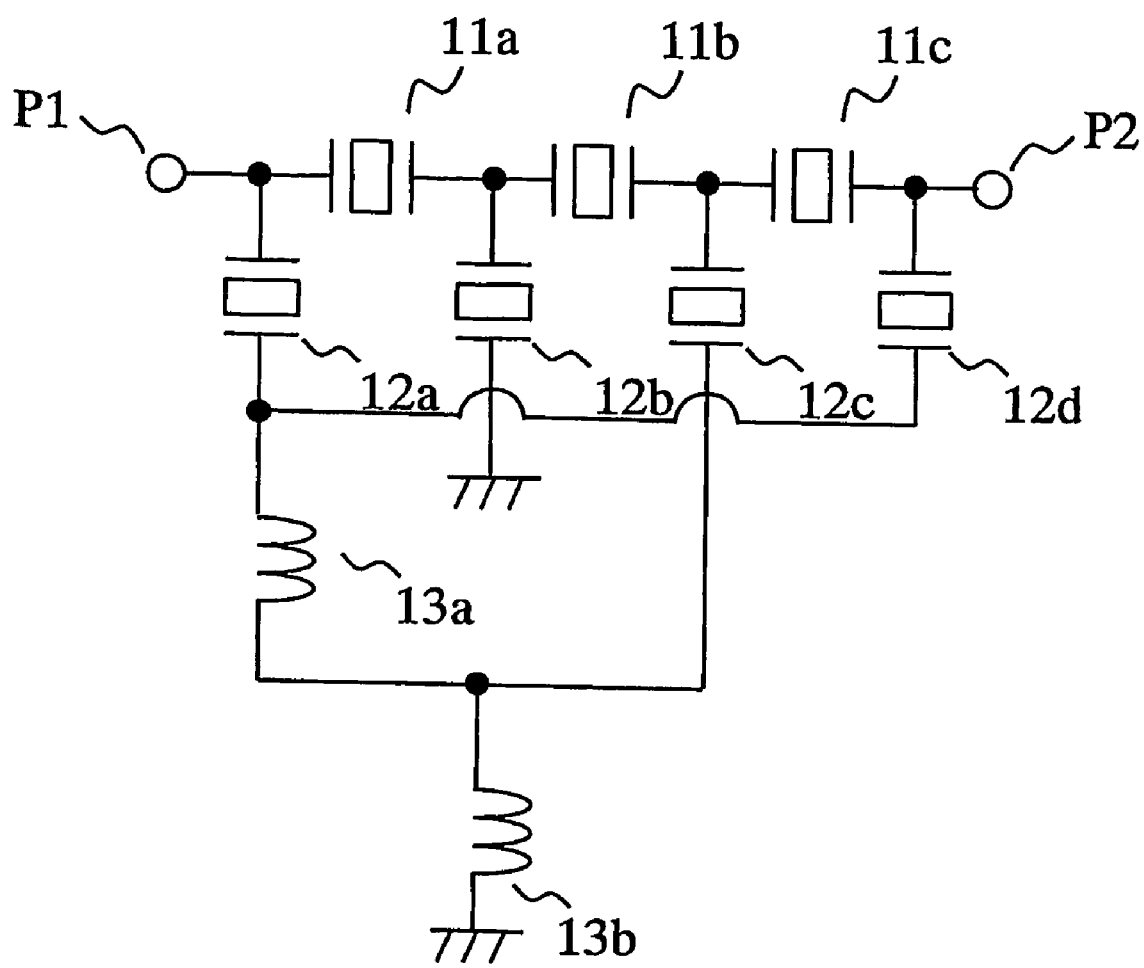
FIG. 16 is a diagram showing a first example of an equivalent circuit of a piezoelectric resonator filter according to a fourth embodiment of the present invention.

FIG. 16 is a diagram showing an equivalent circuit of a piezoelectric resonator filter according to a fourth embodiment of the present invention. In FIG. 16, the connections between serial piezoelectric resonators 11 and parallel piezoelectric resonators 12 are the same as those in the first embodiment. Thus, like numerals are used for like elements, the descriptions thereof being omitted.

In FIG. 16, a parallel piezoelectric resonator 12b is grounded without any intervening inductor. Parallel piezoelectric resonators 12a and 12d are connected to an inductor 13a. The inductor 13a and a parallel piezoelectric resonator 12c are connected to an inductor 13b, which in itself is grounded. In other words, the parallel piezoelectric resonators 12a and 12d are grounded via the inductors 13a and 13b. The parallel piezoelectric resonator 12c is grounded via the inductor 13b. Thus, the parallel piezoelectric resonators 12a, 12c, and 12d are grounded via the common inductor 13b.

Under conditions similar to those used in the first embodiment, the piezoelectric resonator filter of the fourth embodiment (FIG. 16) has shown such characteristics that there is an insertion loss of about −1.45 dB in the pass band and an attenuation amount of about −45 dB in the stop band. Thus, an improvement in insertion loss of about −0.37 dB is obtained relative to the conventional case (FIG. 26).

Figure 17:
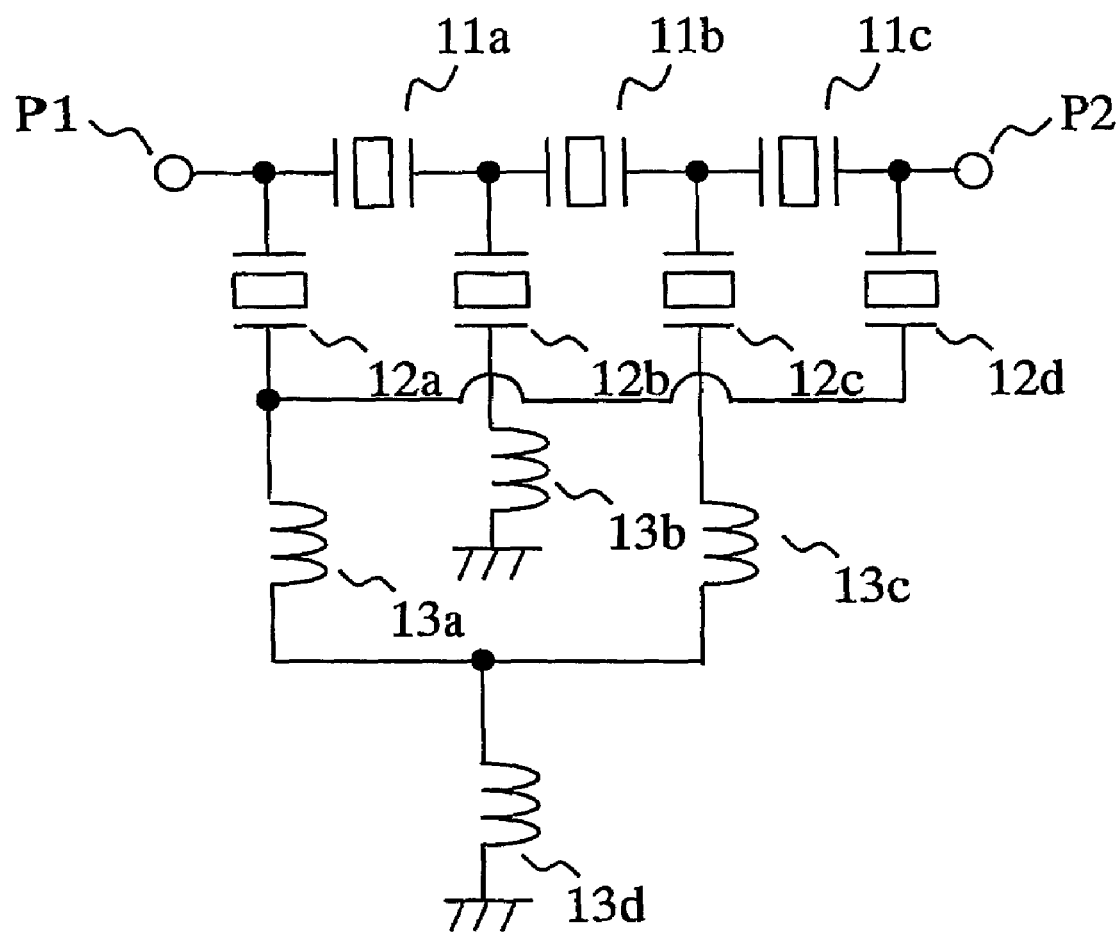
FIG. 17 is a diagram showing a second example of an equivalent circuit of a piezoelectric resonator filter according to the fourth embodiment of the present invention

Next, in a piezoelectric resonator filter shown in FIG. 17, parallel piezoelectric resonators 12a and 12d are connected to a common inductor 13a. A parallel piezoelectric resonator 12b is grounded via an inductor 13b. A parallel piezoelectric resonator 12c is connected to an inductor 13c. The inductors 13a and 13c are grounded via a common inductor 13d. In other words, the parallel piezoelectric resonators 12a and 12d are grounded via the inductors 13a and 13d. The parallel piezoelectric resonator 12c is grounded via the inductors 13c and 13d. Thus, the parallel piezoelectric resonators 12a, 12c, and 12d are grounded via the common inductor 13d.

In the structure of FIG. 17, under conditions similar to those used in the first embodiment, such characteristics have been obtained that there is an insertion loss of about −1.41 dB in the pass band and an attenuation amount of about −45 dB in the stop band. Thus, an improvement in insertion loss of about −0.41 dB is obtained relative to the conventional case (FIG. 26).

Figure 18:
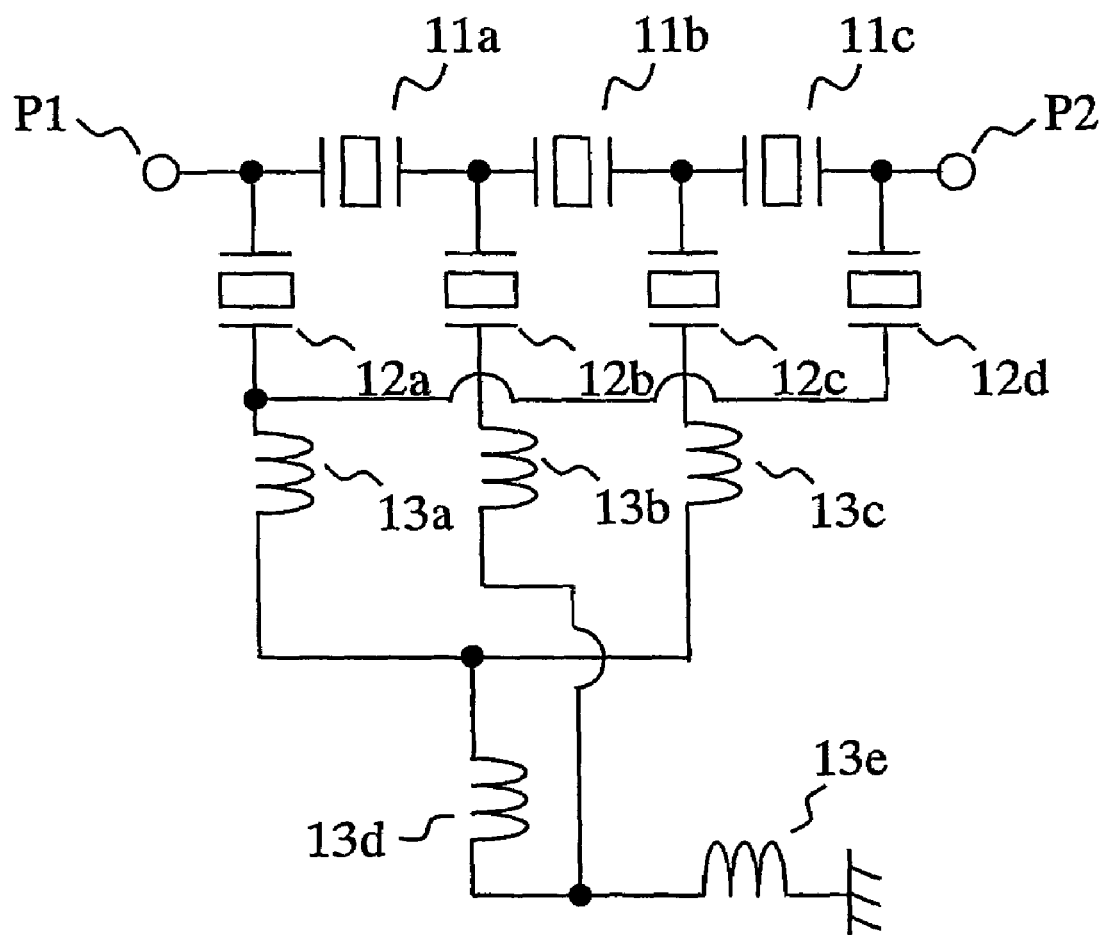
FIG. 18 is a diagram showing a third example of an equivalent circuit of a piezoelectric resonator filter according to the fourth embodiment of the present invention.

Next, in a piezoelectric resonator filter shown in FIG. 18, parallel piezoelectric resonators 12a and 12d are connected to a common inductor 13a. A parallel piezoelectric resonator 12b is connected to an inductor 13b. A parallel piezoelectric resonator 12c is connected to an inductor 13c. The inductors 13a and 13c are connected to a common inductor 13d. The inductor 13d and the inductor 13b are grounded via a common inductor 13e. In other words, the parallel piezoelectric resonators 12a and 12d are grounded via the inductors 13a, 13d, and 13e. The parallel piezoelectric resonator 12b is grounded via the inductors 13b and 13e. The parallel piezoelectric resonator 12c is grounded via the inductors 13c, 13d, and 13e. Thus, each parallel piezoelectric resonator 12 is grounded via the common inductor 13e.

In the structure of FIG. 18, under conditions similar to those used in the first embodiment, such characteristics have been obtained that there is an insertion loss of about −1.41 dB in the pass band and an attenuation amount of about −45 dB in the stop band. Thus, an improvement in insertion loss of about −0.41 dB is obtained relative to the conventional case (FIG. 26).

Figure 19:
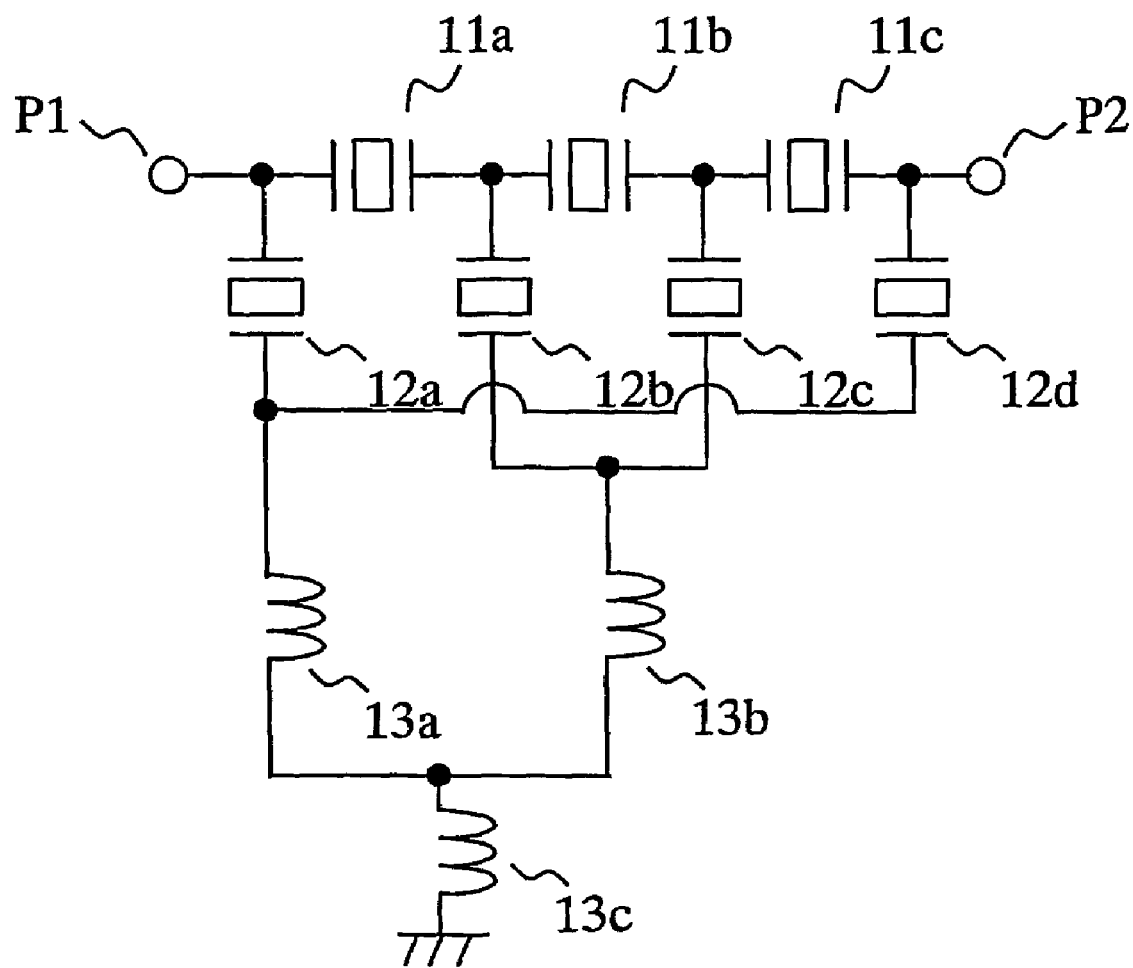
FIG. 19 is a diagram showing a fourth example of an equivalent circuit of a piezoelectric resonator filter according to the fourth embodiment of the present invention.

Next, in a piezoelectric resonator filter shown in FIG. 19, parallel piezoelectric resonators 12a and 12d are connected to a common inductor 13a. Parallel piezoelectric resonators 12b and 12c are connected to a common inductor 13b. The inductors 13a and 13b are grounded via a common inductor 13c. In other words, the parallel piezoelectric resonators 12a and 12d are grounded via the inductors 13a and 13c. The parallel piezoelectric resonators 12b and 12c are grounded via the inductors 13b and 13c. Thus, each parallel piezoelectric resonator 12 is grounded via the common inductor 13c.

In the structure of FIG. 19, under conditions similar to those used in the first embodiment, such characteristics have been obtained that there is an insertion loss of about −1.52 dB in the pass band and an attenuation amount of about −45 dB in the stop band. Thus, an improvement in insertion loss of about −0.30 dB is obtained relative to the conventional case (FIG. 26).

From the results of FIGS. 16 to 19, in the fourth embodiment, it has been confirmed that the effect of insertion loss reduction can be obtained by connecting endmost parallel piezoelectric resonators (which naturally do not adjoin each other) via a common inductor, further commonly-connecting this common inductor with the output section of another parallel piezoelectric resonator or with an inductor or the like which is connected to the output section of another parallel piezoelectric resonator, and grounding them via a further common inductor. In a piezoelectric resonator filter including three or more serial piezoelectric resonators and four or more parallel piezoelectric resonators, at least two non-adjoining parallel piezoelectric resonators among the three or more parallel piezoelectric resonators are referred to as a "filter group". In FIGS. 16 to 19, the parallel piezoelectric resonators included in the filter group (e.g., the parallel piezoelectric resonators 12a and 12c in FIG. 16) are connected to a first inductor (e.g., the inductor 13a in FIG. 16). The common inductor and at least one parallel piezoelectric resonator not included in the filter group (e.g., the parallel piezoelectric resonator 12c in FIG. 16) are grounded via a second inductor (e.g., the inductor 13b in FIG. 16).

The first to fourth embodiments illustrate examples where piezoelectric resonators are used in a serial portion interconnecting an input terminal and an output terminal, the serial portion does not need to be composed of piezoelectric resonators. For example, the serial portion may be composed only of capacitors, composed only of inductors, composed of resonators each constructed from a capacitor and an inductor, or composed of any combination of such elements and piezoelectric resonators. In other words, the serial portion may be composed of reactance elements having a reactance component (e.g., piezoelectric resonators, capacitors, or inductors).

Although the first to fourth embodiments each illustrate a n type ladder filter, similar effects can also be obtained in a T-type ladder filter by ensuring that parallel piezoelectric resonators are grounded via a common inductor(s).

It will be appreciated that the fourth embodiment is not limited to a 7-staged ladder filter as long as a similar structure is employed.

According to the present invention, at least one T-type circuit must be included between the two nodes at which the two commonly-connected parallel piezoelectric resonators are connected to the series arm interconnecting the input and output sections of the piezoelectric resonator filter. A "T-type circuit" is, as shown by a portion 300 enclosed in a dotted line in FIG. 3, a circuit which is composed of a serial piezoelectric resonator 11a, a serial piezo electric resonator 11b, and a parallel piezoelectric resonator 12b which is connected between the serial piezoelectric resonator 11a and the serial piezoelectric resonator 11b. An inductor 13b may or may not be included in the T-type circuit 300.

In the fourth embodiment, all inductors to be used have a self-inductance of 1 nH or less. This is so that the inductors can be provided by simply connecting the parallel piezoelectric resonators to ground by means of wires, chip wiring, external inductors, package wiring, or the like. Thus, the filter can be downsized.

Fifth Embodiment

In a fifth embodiment, structural advantages which will be obtained in the case where FBARs are employed as piezoelectric resonators in the piezoelectric resonator filter according to the present invention will be described. In the case where a wiring structure as shown in FIG. 8 is employed, the grounded side of the parallel piezoelectric resonator 12a is its upper electrode layer, and the grounded side of the parallel piezoelectric resonator 12c is also its upper electrode layer. In other words, the electrodes for being connected to the common inductor are in the same layer, so that these electrodes can be easily grounded via the common inductor.

Similarly, the grounded side of the parallel piezoelectric resonator 12b is its lower electrode layer, and the grounded side of the parallel piezoelectric resonator 12d is also its lower electrode layer. In other words, the electrodes for being connected to the common inductor are in the same layer, so that these electrodes can be easily grounded via the common inductor.

In a ladder filter employing FBARs as piezoelectric resonators, especially where a fundamental ladder structure including resonators in the order of parallel, serial, parallel, serial, etc., is employed as shown in FIG. 7, the grounded side of every other parallel piezoelectric resonator lies in the same layer. Therefore, the structure of the fifth embodiment, whose every other resonator is grounded via a common inductor, not only provides the effect of reducing insertion loss but also provides an advantage in that it is easy to make.

Figure 20:
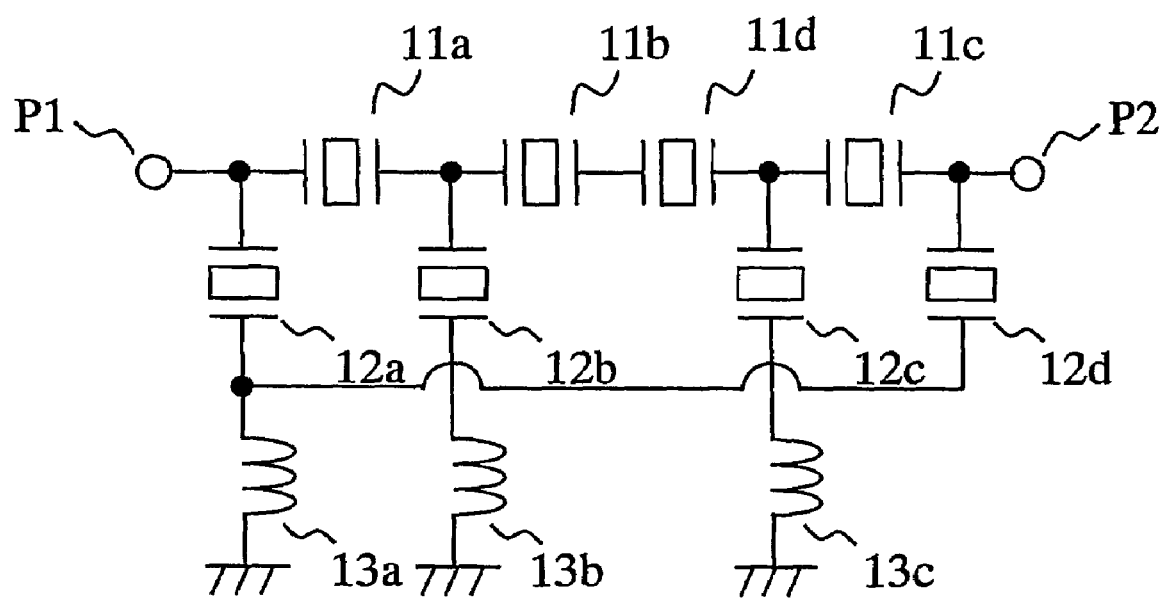
FIG. 20 is a diagram showing an equivalent circuit of a piezoelectric resonator filter according to a fifth embodiment of the present invention.

Although the above embodiment illustrates an example where a fundamental ladder structure is adopted in order to ensure that every other grounded end lies in the same layer via a common inductor, it would also be applicable to employ any arbitrarily designed circuit structure in which grounded ends lie in the same layer. FIG. 20 is a diagram showing an exemplary equivalent circuit of a piezoelectric resonator filter based on the piezoelectric resonator filter shown in FIG. 13, in which a serial piezoelectric resonator 11d is inserted so that the ends which are grounded via a common inductor will lie in the same layer. The piezoelectric resonator filter structure shown in FIG. 13 is difficult to make because the ends which are grounded via a common inductor do not lie in the same layer. As shown in FIG. 20, by providing an even number of serial piezoelectric resonators between the two nodes which exist between the two commonly-connected parallel piezoelectric resonators and the series arm interconnecting the input and output sections P1 and P2, it is ensured that the grounded ends of the two commonly-connected parallel piezoelectric resonators lie in the same layer. In FIG. 20, assuming that the end of a serial piezoelectric resonator 11a which is connected to the input terminal P1 constitutes an upper electrode layer, for example, the end of the serial piezoelectric resonator 11a which lies toward the output terminal P2 constitutes a lower electrode layer. Therefore, an upper electrode layer of a parallel piezoelectric resonator 12a is connected to the upper electrode layer of the serial piezoelectric resonator 11a, and a lower electrode layer of the parallel piezoelectric resonator 12a is grounded via an inductor 13. Moreover, since the serial piezoelectric resonator 11b is connected to the end of the serial piezoelectric resonator 11a which lies toward the output terminal P2, the end of the serial piezoelectric resonator 11b which lies toward the input terminal P1 constitutes a lower electrode layer. A similar connection relationship also exists between serial piezoelectric resonators 11d and 11c, so that a lower electrode layer of a parallel piezoelectric resonator 12d is grounded via an inductor 13a. Thus, by designing wiring such that any layer that is connected to an inductor lies in the same layer, it becomes easy to ground parallel piezoelectric resonators via a common inductor.

According to the present invention, at least one T-type circuit must be included between the two nodes at which the two commonly-connected parallel piezoelectric resonators are connected to the series arm interconnecting the input and output sections of the piezoelectric resonator filter. A "T-type circuit" is, as shown by a portion 300 enclosed in a dotted line in FIG. 3, a circuit which is composed of a serial piezoelectric resonator 11a, a serial piezoelectric resonator 11b, and a parallel piezoelectric resonator 12b which is connected between the serial piezoelectric resonator 11a and the serial piezoelectric resonator 11b. An inductor 13b may or may not be included in the T-type circuit 300.

Note that it is ensured that the grounded ends of the two commonly-connected parallel piezoelectric resonators lie in the same layer as long as an even number of serial piezoelectric resonators are provided between the two nodes which exist between the two commonly-connected parallel piezoelectric resonators and the series arm interconnecting the input and output sections of the piezoelectric resonator filter. In this case, in each of the two commonly-connected parallel arms, it is desirable that an odd number of parallel piezoelectric resonators exist between the node with the series arm and the node with the common inductor, or that the two commonly-connected parallel arms include the same number of parallel piezoelectric resonators. As a result, it is ensured that the electrodes which are connected to the common inductor lie in the same layer, so that the piezoelectric resonator filter structure becomes easy to make.

In the fifth embodiment, the series arm may be composed only of capacitors, or composed of a combination of serial piezoelectric resonators and capacitors. In either case, the same conditions as those described above hold true for ensuring that the common electrodes of the commonly-connected parallel piezoelectric resonators lie in the same layer.

Sixth Embodiment

Figure 21:
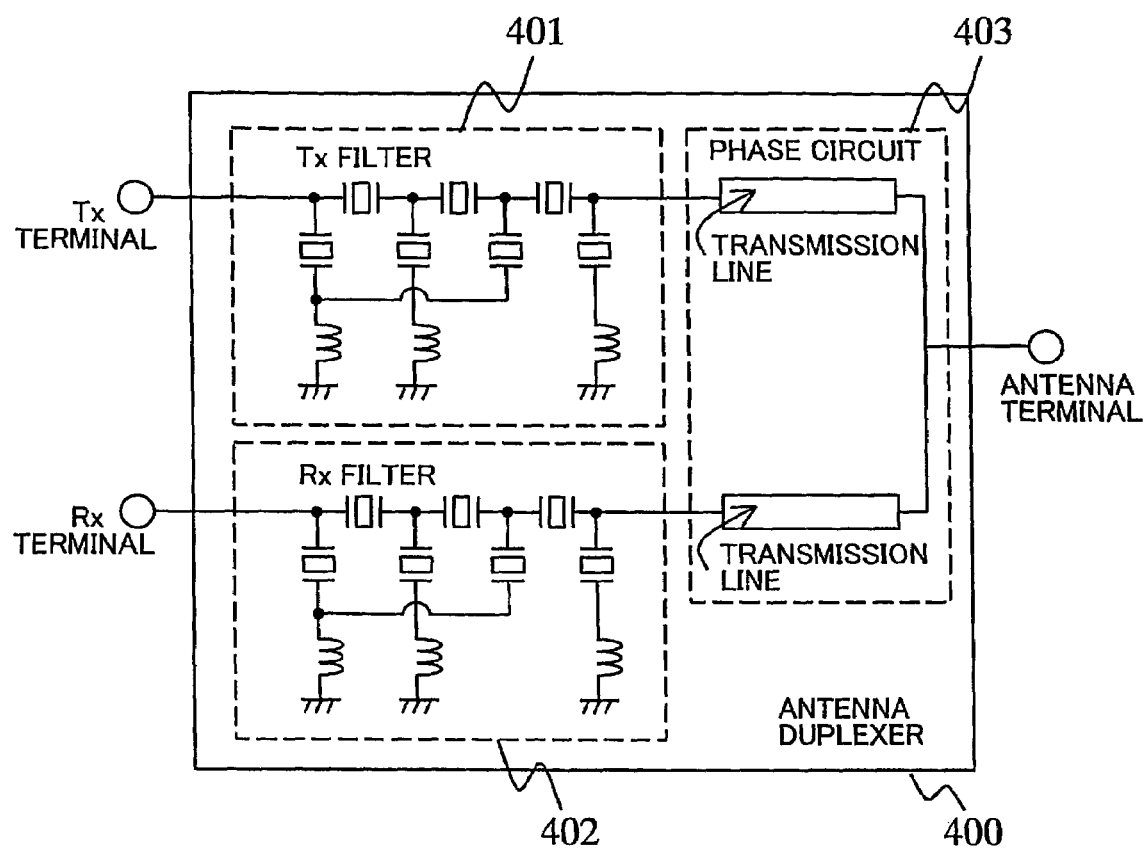
FIG. 21 is a diagram illustrating an exemplary structure of an antenna duplexer 400 according to a sixth embodiment of the present invention.

FIG. 21 is a diagram illustrating an exemplary structure of an antenna duplexer 400 according to a sixth embodiment of the present invention. In FIG. 21, the antenna duplexer 400 is composed of: a Tx filter (transmission filter) 401 to which the piezoelectric resonator filter according to the present invention is applied; an Rx filter (reception filter) 402 to which the piezoelectric resonator filter according to the present invention is applied; and a phase shift circuit 403, which is composed of two transmission lines. The Tx filter 401 allows any signal in the transmission band to pass therethrough, while attenuating any signal in the reception band. The Rx filter 402 allows any signal in the reception band to pass therethrough, while attenuating any signal in the transmission band. Thus, an antenna duplexer having excellent characteristics (low loss, etc.) can be obtained. Although FIG. 21 illustrates a case where piezoelectric resonator filter (FIG. 1) according to the first embodiment is employed for each filter structure, the number of filters and the number of piezoelectric resonators composing each filter, etc., can be freely designed, rather than being limited to those exemplified in FIG. 21. It is needless to say that, by employing any of the piezoelectric resonator filters described in the first to fifth embodiments of the present invention for the structure of the antenna duplexer 400, an antenna duplexer which is lower in loss than conventionally can be provided. The filter to which the piezoelectric resonator filters of the present invention are applied may be only one of the Tx filter 401 or the Rx filter 402.

Seventh Embodiment

Figure 22:
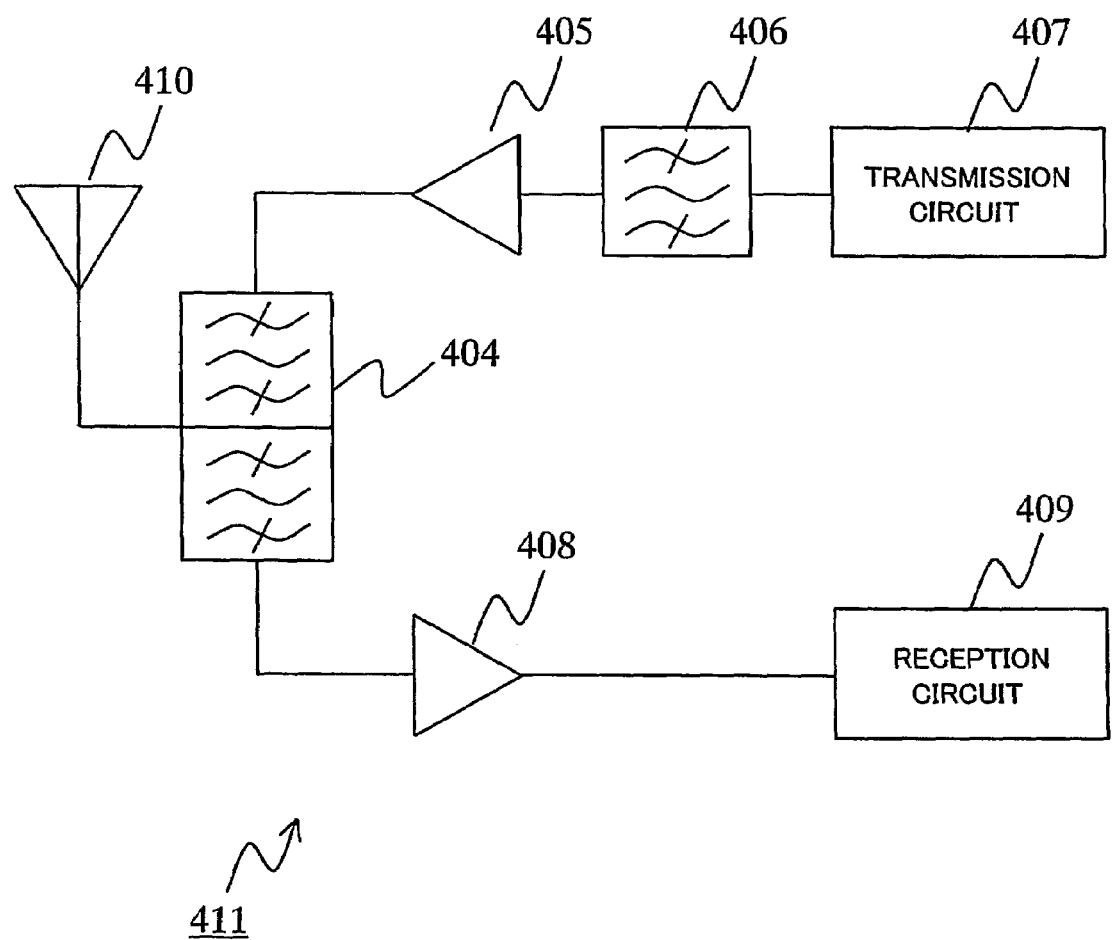
FIG. 22 is a diagram illustrating an exemplary structure of a communication device 411 according to a seventh embodiment of the present invention.
Figure 23:
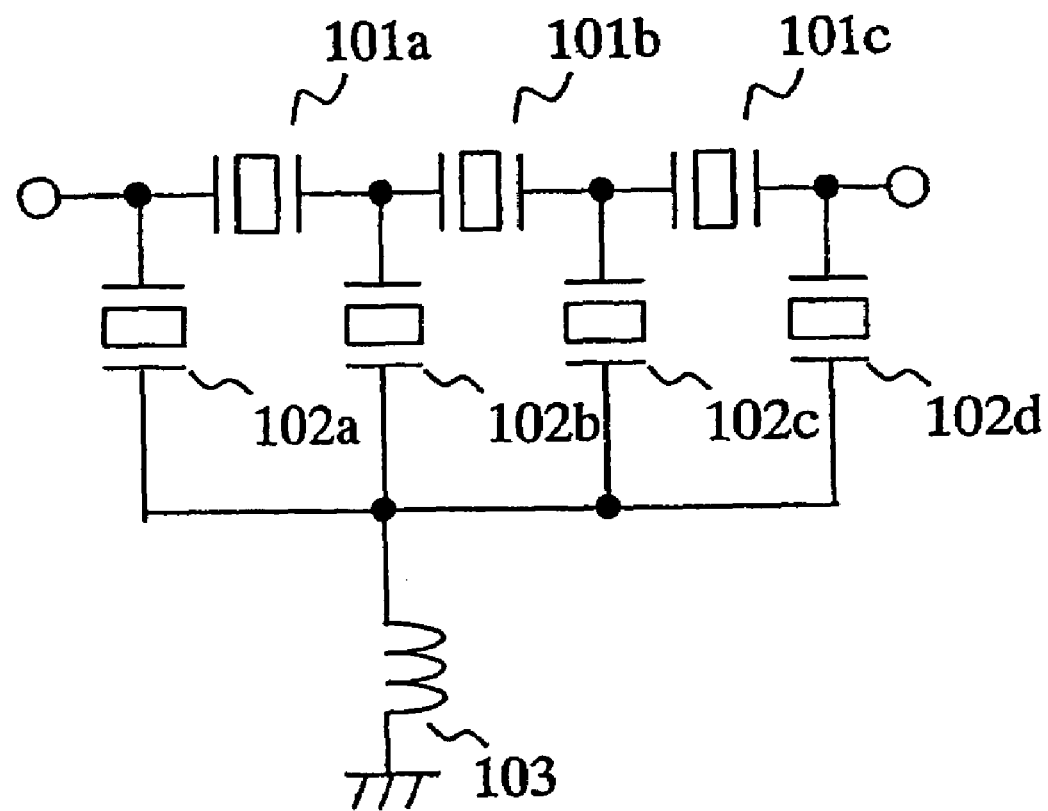
FIG. 23 is a diagram illustrating a conventional piezoelectric resonator filter in which all parallel piezoelectric resonators are grounded via a common inductor.
Figure 24:
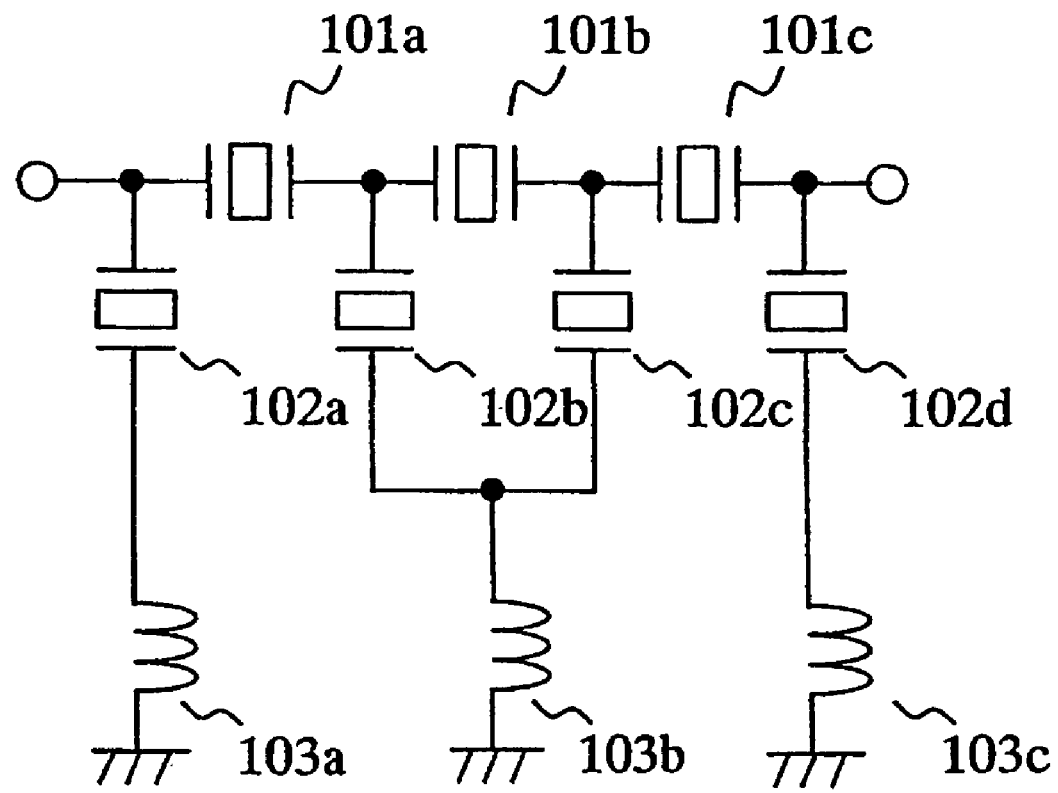
FIG. 24 is a diagram illustrating a conventional piezoelectric resonator filter in which two parallel piezoelectric resonators other than those at the ends are connected to a common inductor.
Figure 25:
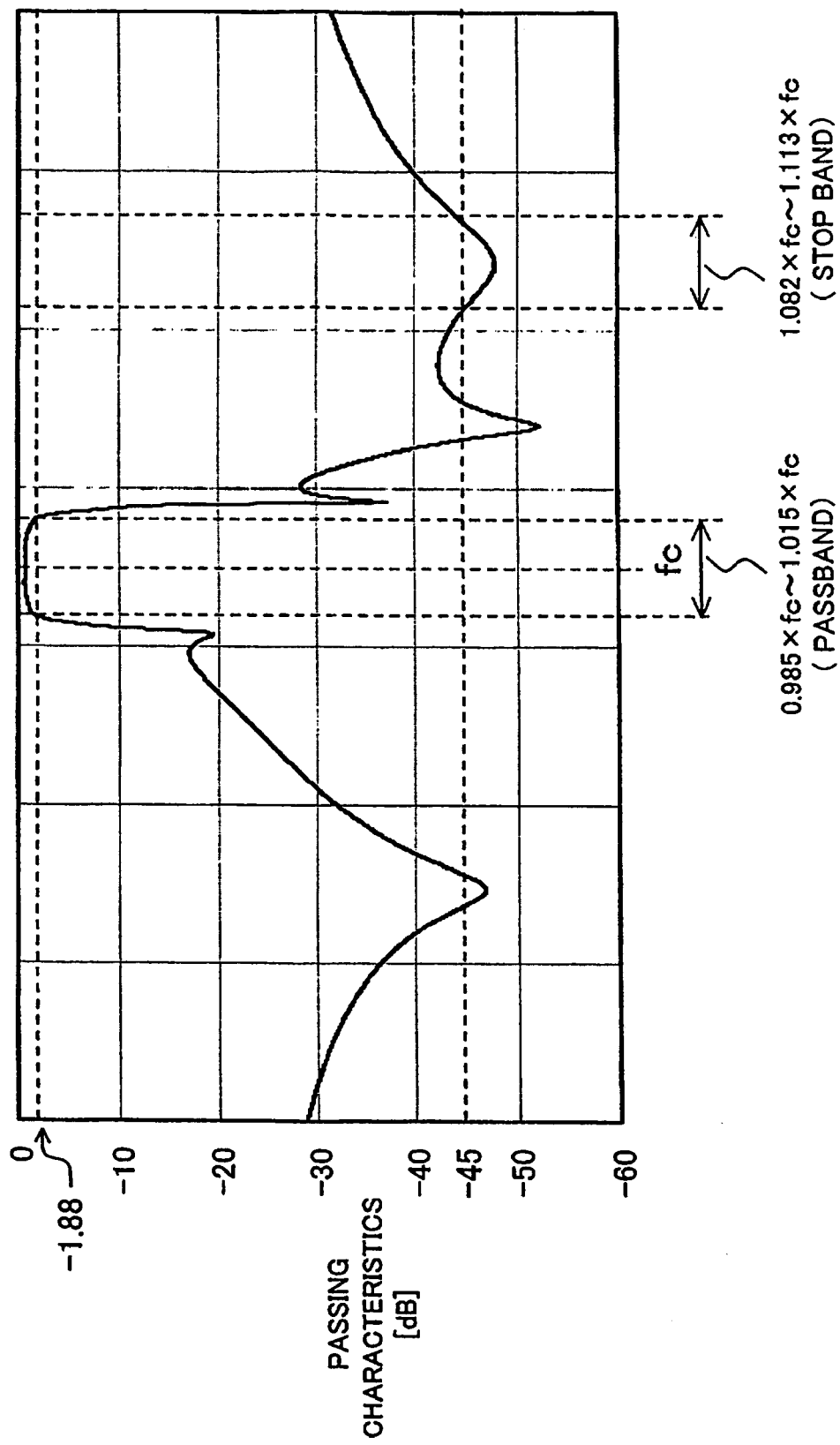
FIG. 25 is a graph illustrating passing characteristics for an input signal against frequency in the conventional piezoelectric resonator filter shown in FIG. 23.

FIG. 22 is a diagram illustrating an exemplary structure of a communication device 411 according to a seventh embodiment of the present invention. In FIG. 22, the communication device 411 comprises: the antenna duplexer 404 shown in FIG. 21; a transmission amplifier 405; a filter 406; a transmission circuit 407; a reception amplifier 408; a reception circuit 409; and an antenna 410. A transmission signal which is output from the transmission circuit 407 is input to the antenna duplexer 404 via the filter 406 and the transmission amplifier 405. The transmission signal having been input to the antenna duplexer 404 is transmitted via the antenna 410. On the other hand, a signal which is received by the antenna 410 is led through the antenna duplexer 404 and the reception amplifier 408, so as to be input to the reception circuit 409. Thus, a compact and high-performance communication device can be realized by employing the antenna duplexer 404 having excellent characteristics (low loss, etc.). A piezoelectric resonator filter according to the present invention may also be applied to the filter 406. Any communication device can be freely designed, without being limited to that which is exemplified in FIG. 22. The specific portions at which to employ a piezoelectric resonator filter according to the present invention are not limited to duplexers or filters. For example, a piezoelectric resonator filter according to the present invention may be employed as a filter in the receiving end.

While the invention has been described in detail, the foregoing description is in all aspects illustrative and not restrictive. It is understood that numerous other modifications and variations can be devised without departing from the scope of the invention.

INDUSTRIAL APPLICABILITY

A piezoelectric resonator filter according to the present invention is small in size, incurs little insertion loss, and yet secures sufficient characteristics in the stop band, and therefore is suitably used in mobile phones, wireless communications, wireless Internet connection, and the like.

The invention claimed is:

1. A piezoelectric resonator filter for allowing a high-frequency signal in a desired frequency band to pass therethrough, the piezoelectric resonator filter comprising:
   three or more reactance elements in serial connection between an input terminal and an output terminal; and
   at least four or more piezoelectric resonators in parallel connection between the input terminal and the output terminal, the three or more reactance elements and the four or more piezoelectric resonators being disposed in a ladder connection, wherein
   among the four or more piezoelectric resonators, at least two non-adjoining piezoelectric resonators are included in a filter group,
   the at least two non-adjoining piezoelectric resonators in the filter group share a common electrode which is connected to a first inductor component, the common electrode being opposite to electrodes which are connected to the three or more reactance elements, and
   the first inductor component and at least one piezoelectric resonator not included in the filter group are grounded via a second inductor component.

2. The piezoelectric resonator filter according to claim 1, wherein, among the four or more piezoelectric resonators, at least one piezoelectric resonator, which is interposed between the at least two non-adjoining piezoelectric resonators sharing the common electrode, has an electrode connected between two adjoining reactance elements of the three or more reactance elements.

3. The piezoelectric resonator filter according to claim 1, wherein at least one of the three or more reactance elements is a piezoelectric resonator.

4. The piezoelectric resonator filter according to claim 1, wherein at least one of the three or more reactance elements is a surface acoustic wave filter.

5. The piezoelectric resonator filter according to claim 1, wherein at least one of the three or more reactance elements is a capacitor or an inductor.

6. The piezoelectric resonator filter according to claim 1, wherein, among the at least two non-adjoining piezoelectric resonators sharing the common electrode, one piezoelectric resonator has an electrode connected to the input terminal, and another piezoelectric resonator has an electrode connected to the output terminal.

7. A communication device comprising a filter, wherein the filter is:
   a piezoelectric resonator filter for allowing a high-frequency signal in a desired frequency band to pass therethrough, the piezoelectric resonator filter including three or more reactance elements in serial connection between an input terminal and an output terminal and at least four or more piezoelectric resonators in parallel connection between the input terminal and the output terminal, the three or more reactance elements and the four or more piezoelectric resonators being disposed in a ladder connection, wherein
   among the four or more piezoelectric resonators, at least two non-adjoining piezoelectric resonators are included in a filter group,
   the at least two non-adjoining piezoelectric resonators in the filter group share a common electrode which is connected to a first inductor component, the common electrode being opposite to electrodes which are connected to the three or more reactance elements, and
   the first inductor component and at least one piezoelectric resonator not included in the filter group are grounded via a second inductor component.

8. The communication device according to claim 7, wherein, among the four or more piezoelectric resonators, at least one piezoelectric resonator, which is interposed between the at least two non-adjoining piezoelectric resonators sharing the common electrode, has an electrode connected between two adjoining reactance elements of the three or more reactance elements.

9. The communication device according to claim 7, wherein at least one of the three or more reactance elements is a piezoelectric resonator.

10. The communication device according to claim 7, wherein at least one of the three or more reactance elements is a surface acoustic wave filter.

11. The communication device according to claim 7, wherein at least one of the three or more reactance elements is a capacitor or an inductor.

12. The communication device according to claim 7, wherein, among the at least two non-adjoining piezoelectric resonators sharing the common electrode, one piezoelectric resonator has an electrode connected to the input terminal, and another piezoelectric resonator has an electrode connected to the output terminal.

13. A duplexer comprising:
   a transmission filter for allowing a signal in a transmission band to pass therethrough and attenuating a signal in a reception band; and
   a reception filter for allowing a signal in the reception band to pass therethrough and attenuating a signal in the transmission band,
   wherein the transmission filter and/or the reception filter is:
      a piezoelectric resonator filter for allowing a high-frequency signal in a desired frequency band to pass therethrough, the piezoelectric resonator filter including three or more reactance elements in serial connection between an input terminal and an output terminal and at least four or more piezoelectric resonators in parallel connection between the input terminal and the output terminal, the three or more reactance elements and the four or more piezoelectric resonators being disposed in a ladder connection, wherein among the four or more piezoelectric resonators, at least two non-adjoining piezoelectric resonators are included in a filter group, the at least two non-adjoining piezoelectric resonators in the filter group share a common electrode which is connected to a first inductor component, the common electrode being opposite to electrodes which are connected to the three or more reactance elements, and the first inductor component and at least one piezoelectric resonator not included in the filter group are grounded via a second inductor component.

14. The duplexer according to claim 13, wherein, among the four or more piezoelectric resonators, at least one piezoelectric resonator, which is interposed between the at least two non-adjoining piezoelectric resonators sharing the common electrode, has an electrode connected between two adjoining reactance elements of the three or more reactance elements.

15. The duplexer according to claim 13, wherein at least one of the three or more reactance elements is a piezoelectric resonator.

16. The duplexer according to claim 13, wherein at least one of the three or more reactance elements is a surface acoustic wave filter.

17. The duplexer according to claim 13, wherein at least one of the three or more reactance elements is a capacitor or an inductor.

18. The duplexer according to claim 13, wherein, among the at least two non-adjoining piezoelectric resonators sharing the common electrode, one piezoelectric resonator has an electrode connected to the input terminal, and another piezoelectric resonator has an electrode connected to the output terminal.

* * * * *